United States Patent [19]
Yasuda

[11] Patent Number: 5,590,155
[45] Date of Patent: Dec. 31, 1996

[54] EQUIPMENT FOR GENERATING A TRANSMIT SIGNAL FROM FIRST AND SECOND DIGITAL SIGNALS

[75] Inventor: Akira Yasuda, Tokyo, Japan

[73] Assignee: Kabushiki Kaisha Toshiba, Kawasaki, Japan

[21] Appl. No.: 461,972

[22] Filed: Jun. 5, 1995

Related U.S. Application Data

[63] Continuation-in-part of Ser. No. 143,064, Oct. 29, 1993.

[30] Foreign Application Priority Data

Oct. 30, 1992 [JP] Japan ................................. 4-292306
Jun. 9, 1994 [JP] Japan ................................. 6-127770

[51] Int. Cl.$^6$ ............................ H04L 5/12; H04L 23/02
[52] U.S. Cl. .................... 375/261; 375/281; 375/308; 332/103
[58] Field of Search .................... 375/279, 261, 375/281, 308; 332/103, 144

[56] References Cited

U.S. PATENT DOCUMENTS

| | | | |
|---|---|---|---|
| 4,613,976 | 9/1986 | Sewerinson et al. | 375/308 |
| 4,962,510 | 10/1990 | McDavid et al. | 375/308 |
| 5,225,795 | 7/1993 | Iinuma | 375/308 |
| 5,255,288 | 10/1993 | Ichihara | 375/308 |
| 5,303,412 | 4/1994 | Kushner | 455/260 |
| 5,379,322 | 1/1995 | Kosaka | 375/281 |

Primary Examiner—Stephen Chin
Assistant Examiner—Don Vo
Attorney, Agent, or Firm—Oblon, Spivak, McClelland, Maier & Neustadt, P.C.

[57] ABSTRACT

A transmitting equipment includes a holding circuit for dividing a time-series digital signal into I and Q digital signals, holding the I and Q digital signals, and outputting them in parallel, a waveform forming circuit, having a memory for storing a plurality of oversampling codes corresponding to the I and Q digital signals, for reading the oversampling codes out of the memory and outputting them as I and Q waveform forming signals, a modulation circuit for orthogonally modulating the I and Q waveform forming signals output from the waveform forming circuit and outputting I and Q modulated signals, an addition circuit for adding the I and Q modulated signals output from the modulation circuit and outputting I and Q sum signals, a filter for removing high-frequency components from the I and Q sum signals output from the addition circuit, and a transmitting signal generation circuit for adding the I and Q sum signals from which the high-frequency components are removed by the filter and generating a transmitting signal.

16 Claims, 22 Drawing Sheets

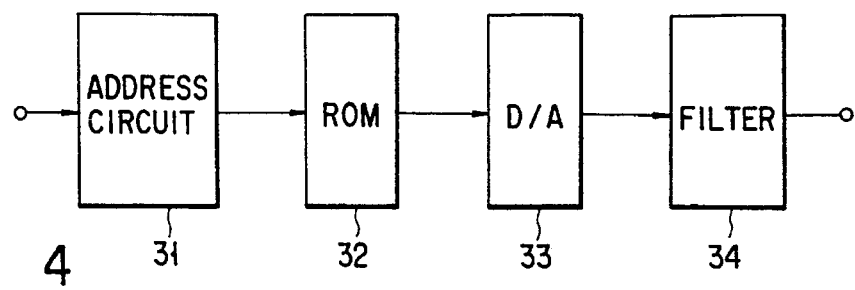
F I G. 4
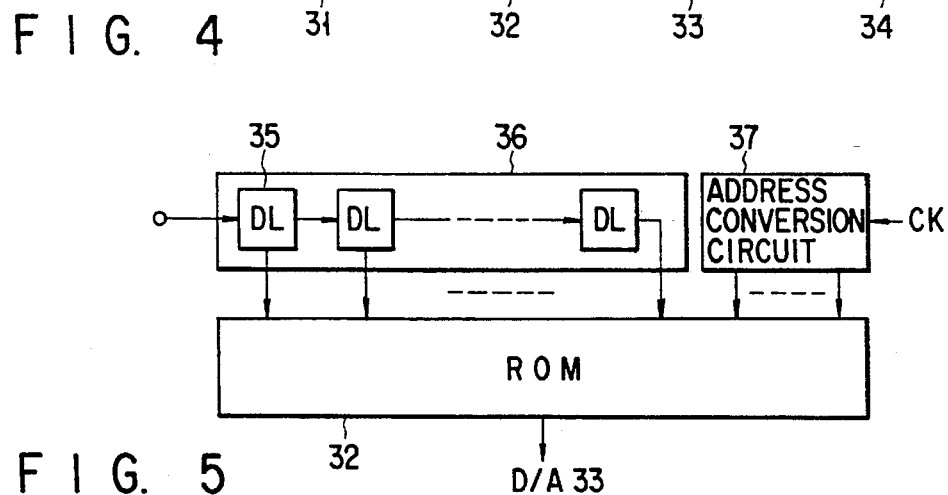
F I G. 5
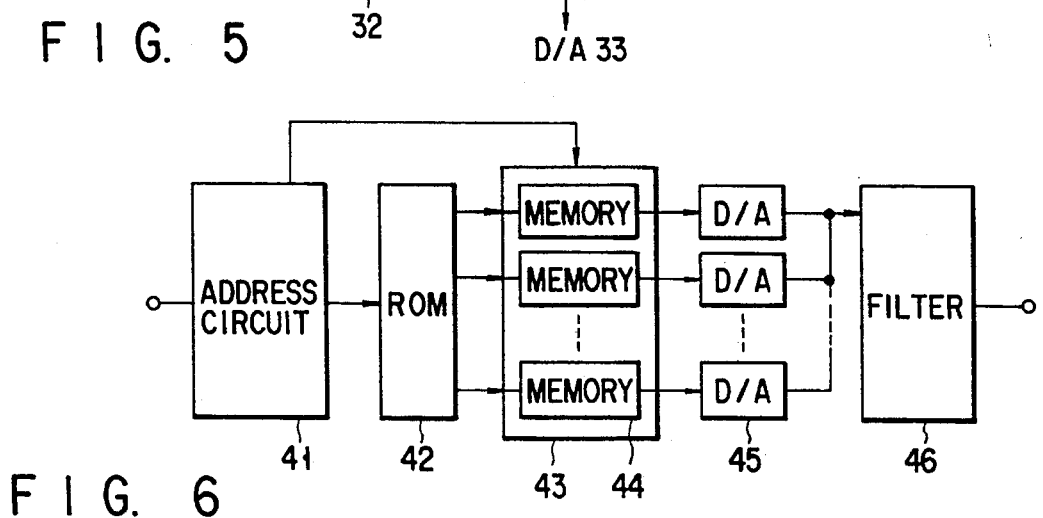
F I G. 6
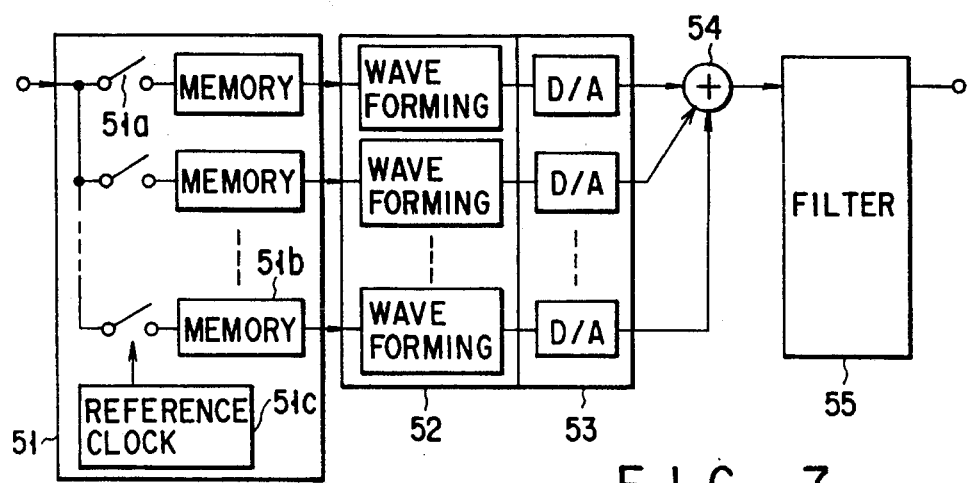
F I G. 7

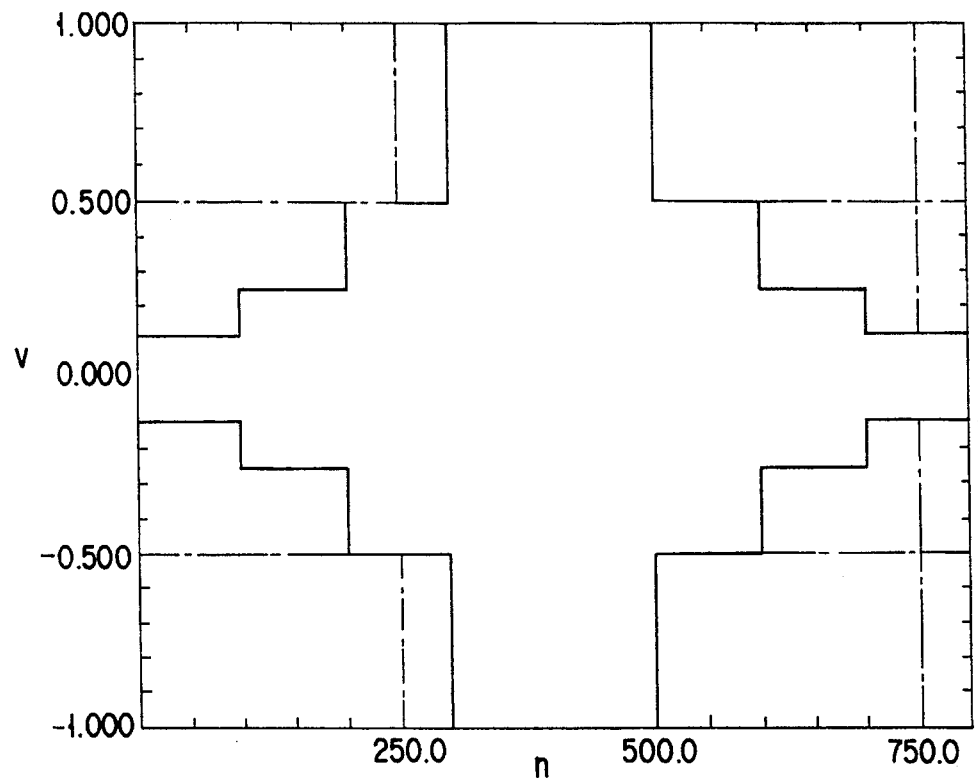
F I G. 14
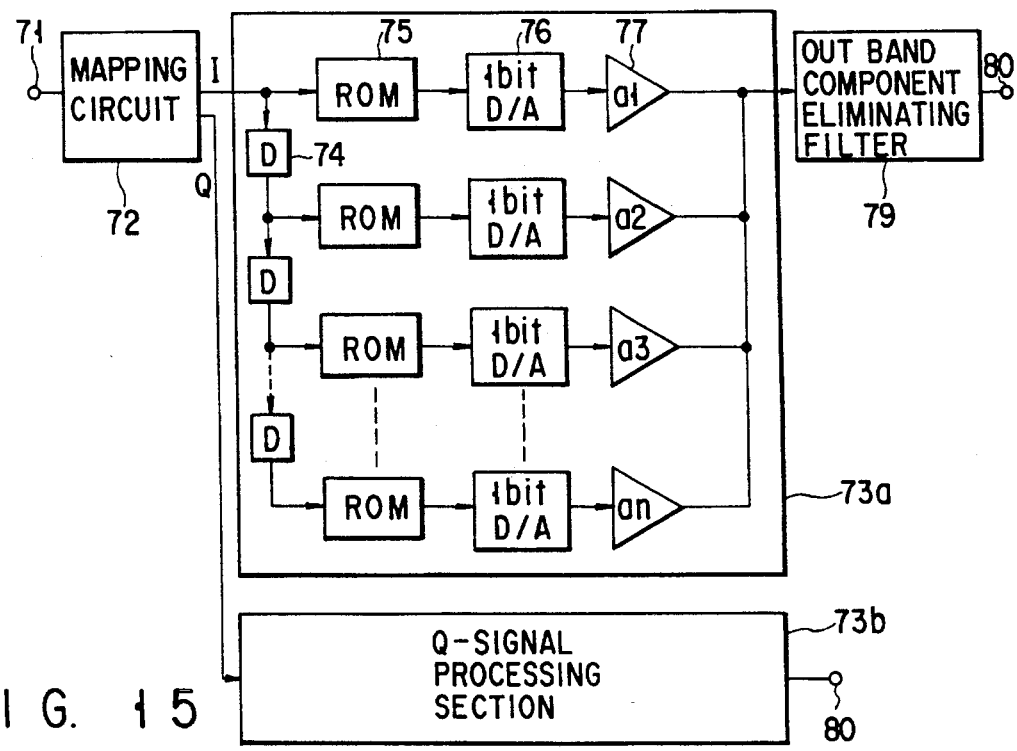
F I G. 15

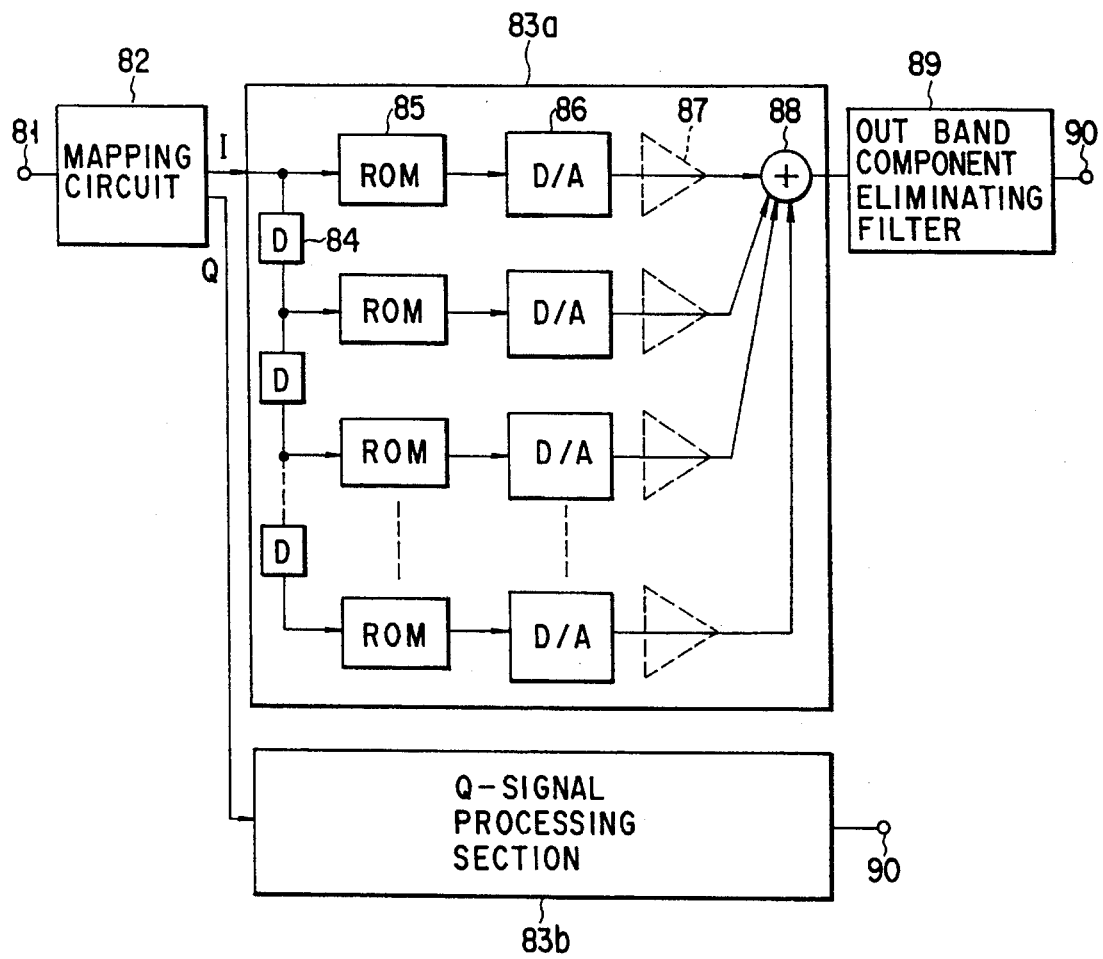
F I G. 16

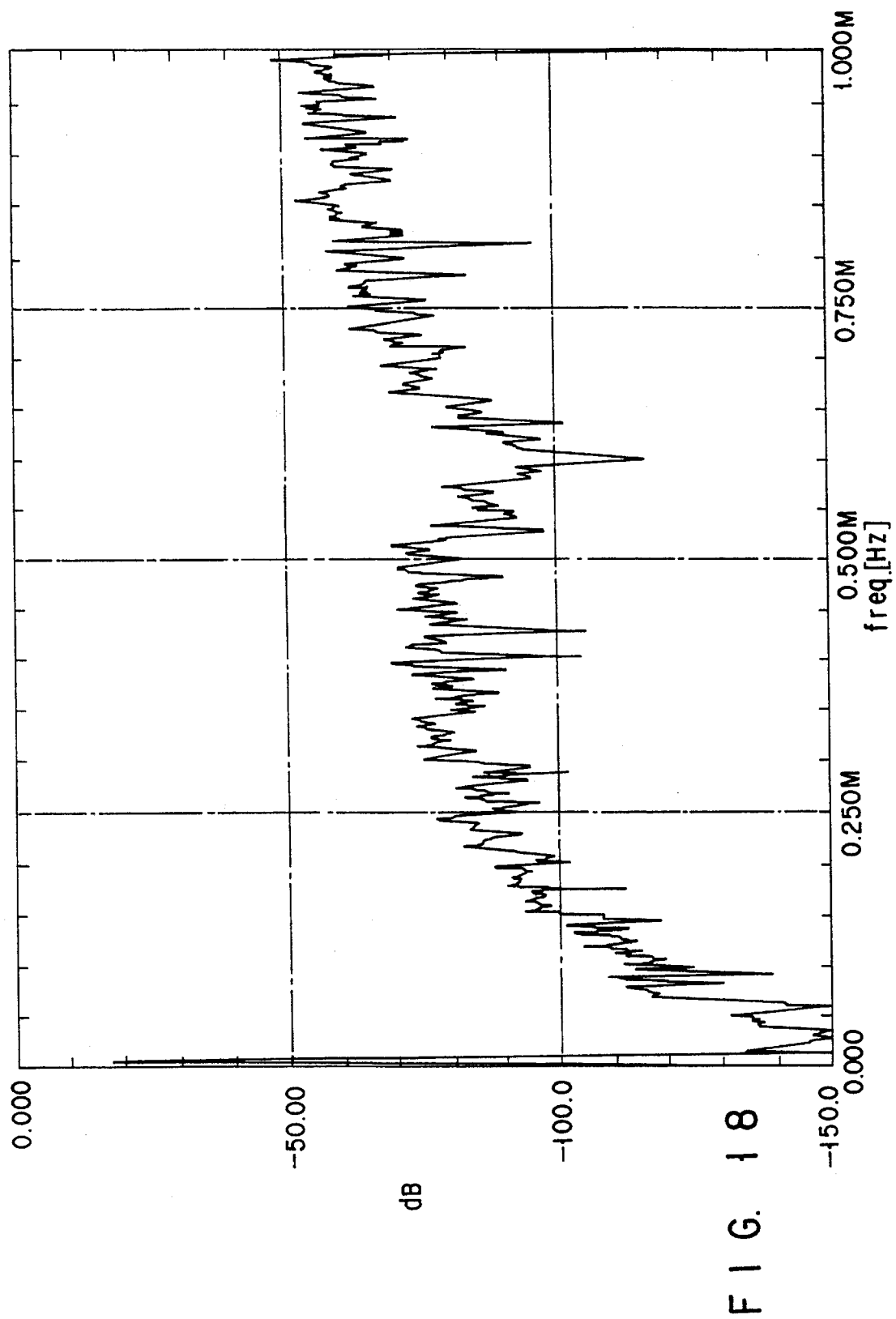
F I G. 18

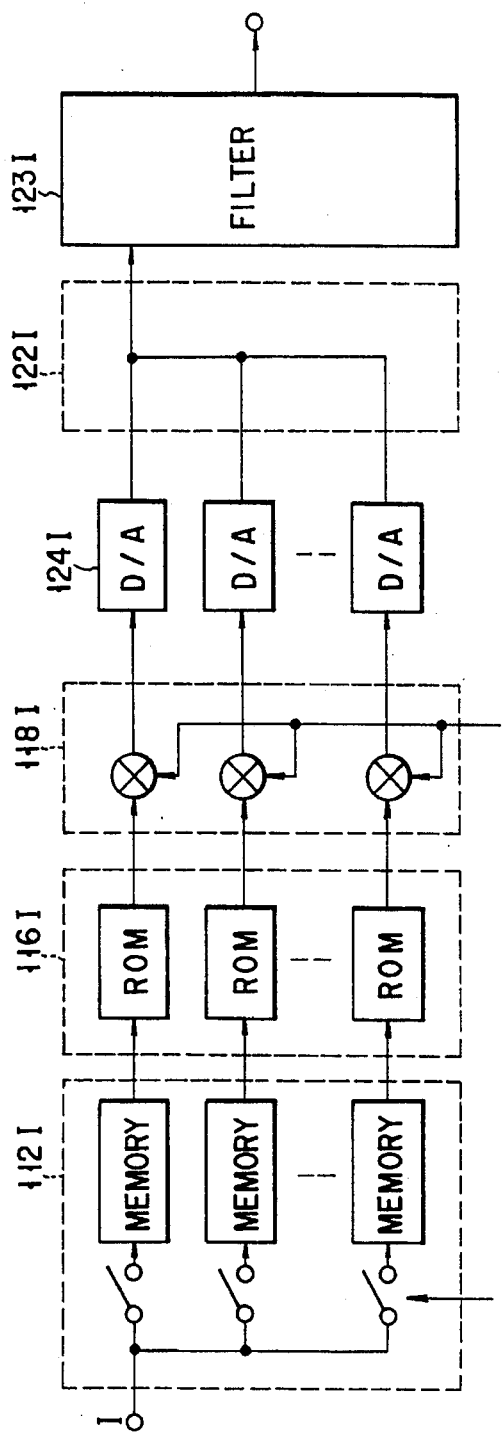
F I G. 22A
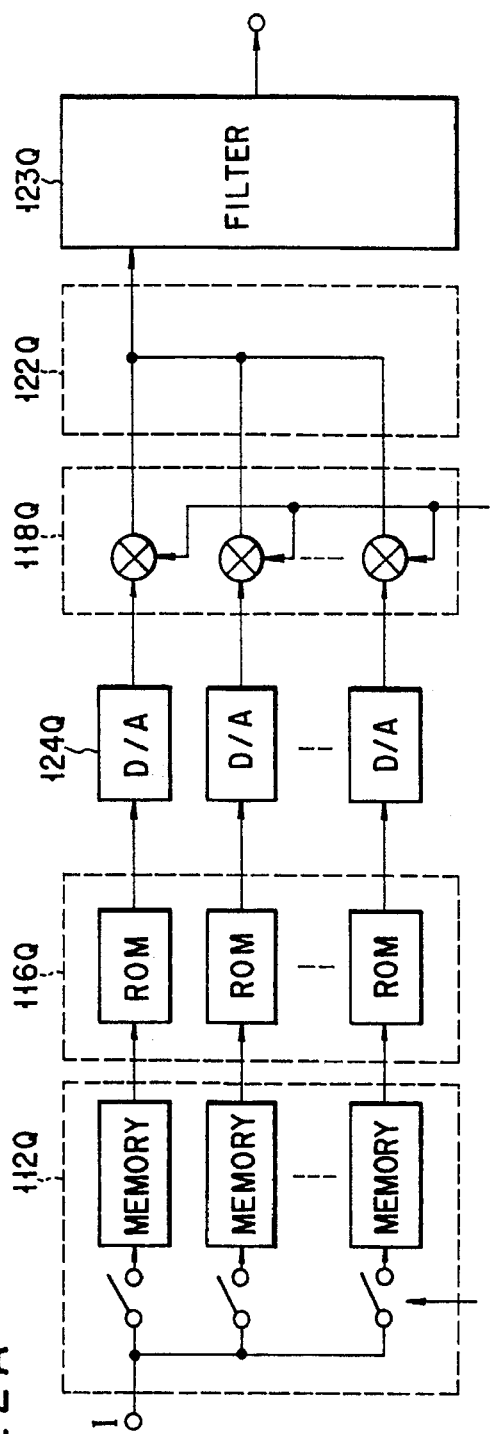
F I G. 22B

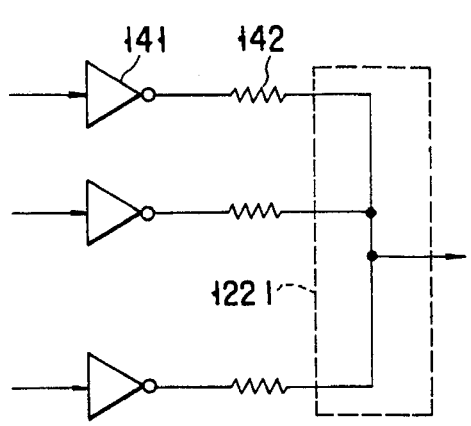
F I G. 23
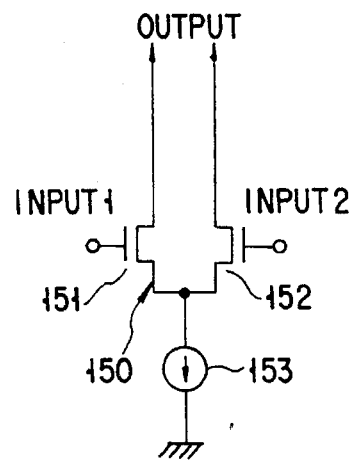
F I G. 24
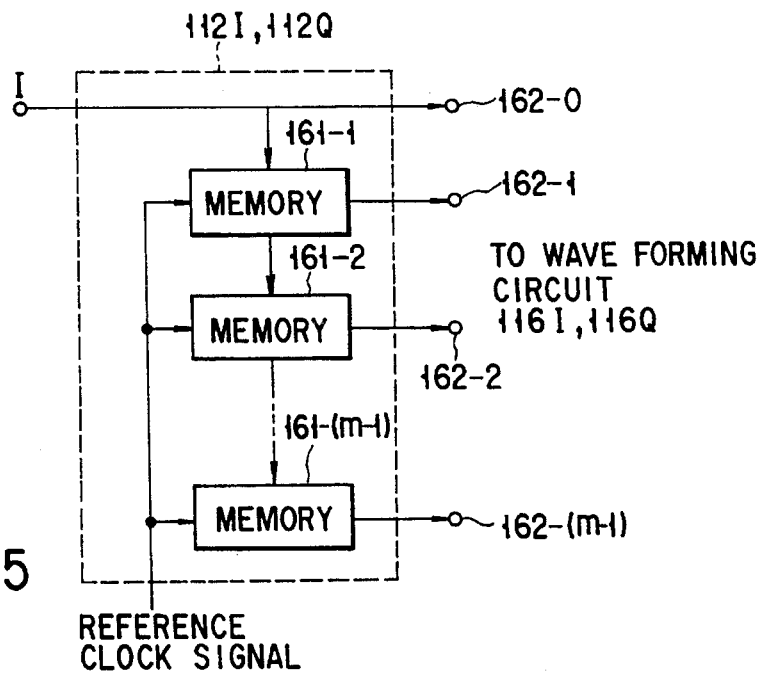
F I G. 25
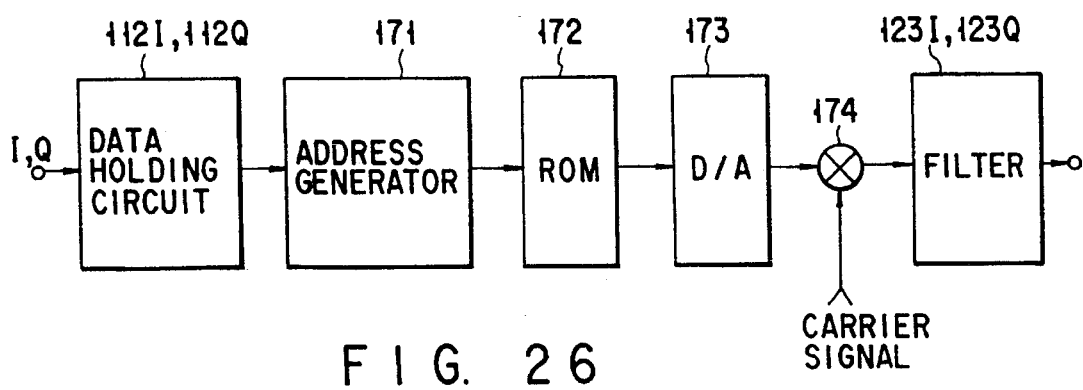
F I G. 26

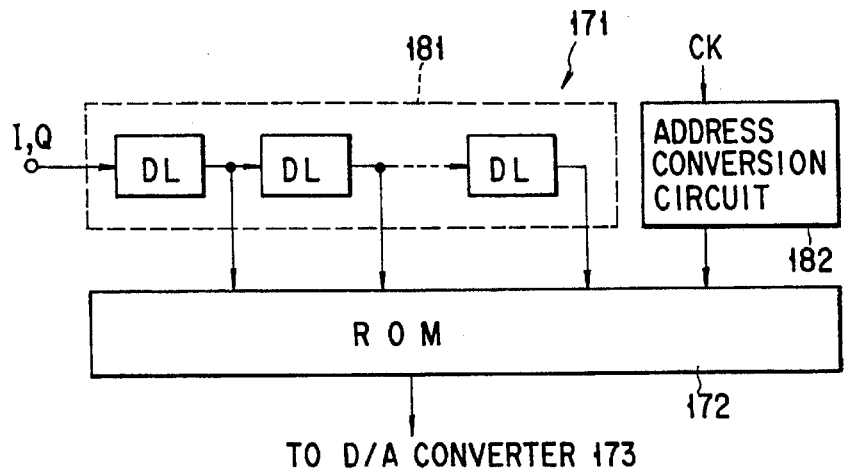
FIG. 27
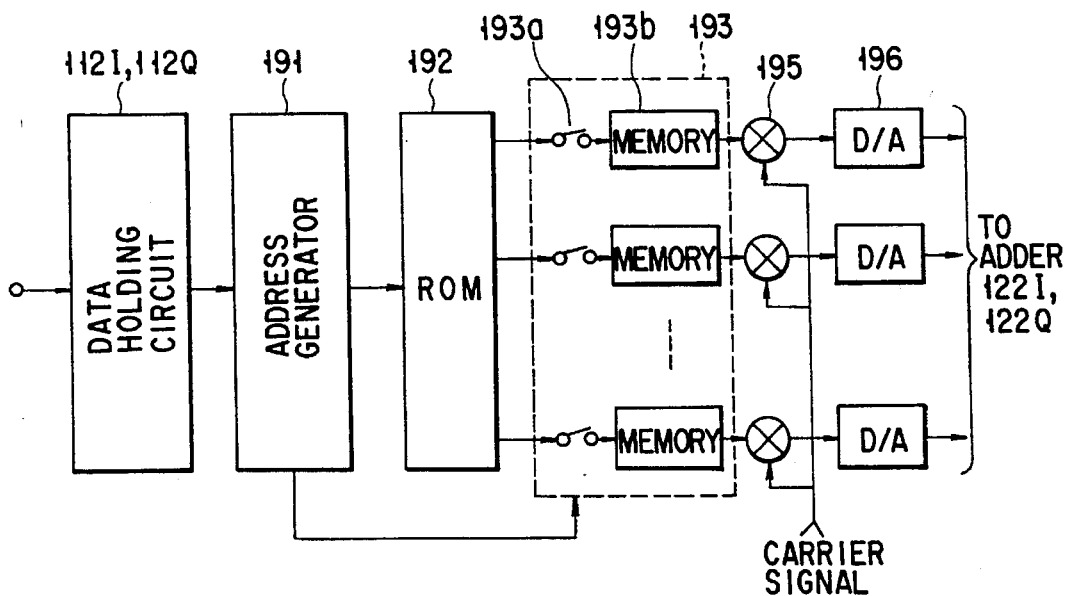
FIG. 28
| $a_1$ | $a_2$ | $a_3$ | $a_4$ | $a_5$ |
|---|---|---|---|---|
| $b_1$ | $b_2$ | $b_3$ | $b_4$ | $b_5$ |
| $c_1$ | $c_2$ | $c_3$ | $c_4$ | $c_5$ |
| $d_1$ | $d_2$ | $d_3$ | $d_4$ | $d_5$ |
| $e_1$ | $e_2$ | $e_3$ | $e_4$ | $e_5$ |
FIG. 29

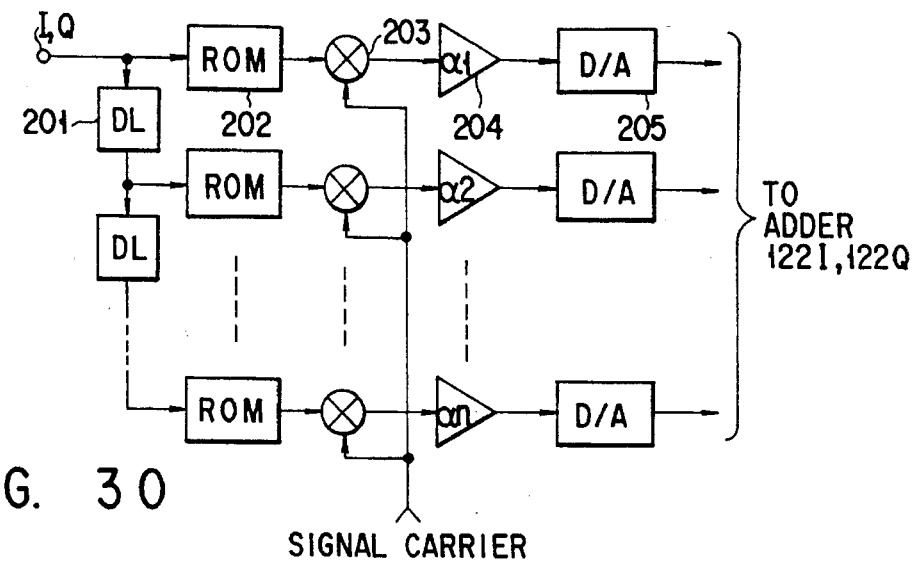
F I G. 30
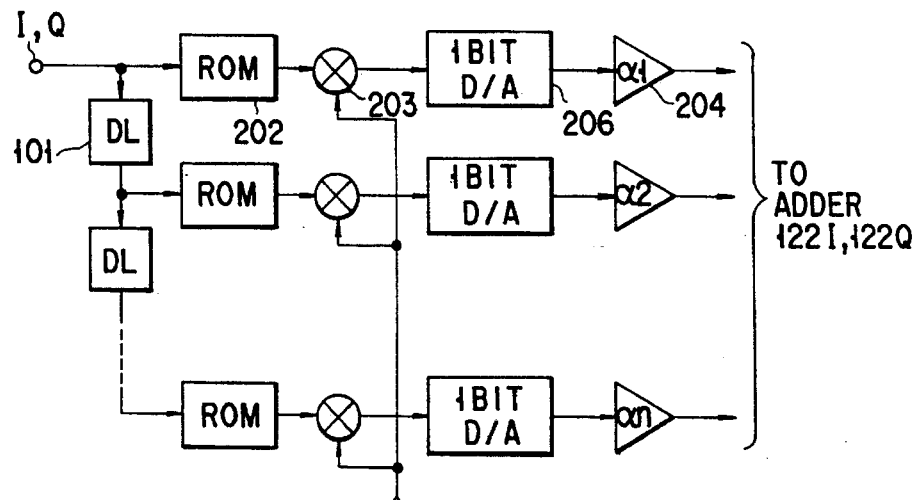
F I G. 31
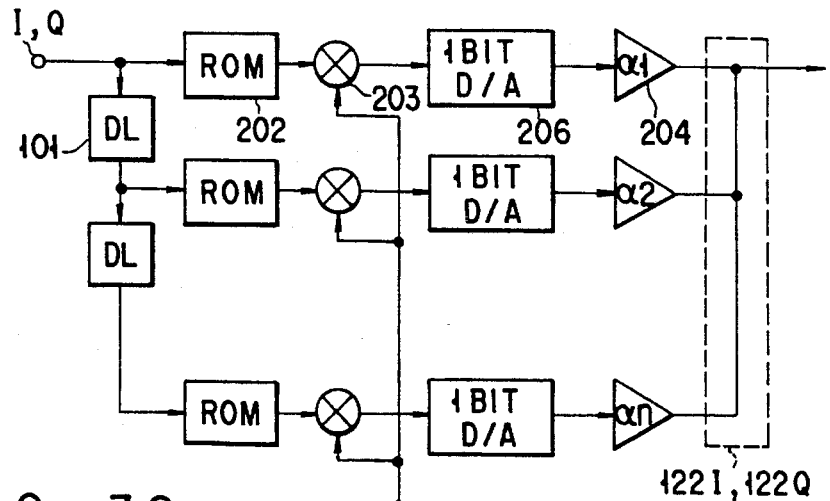
F I G. 32

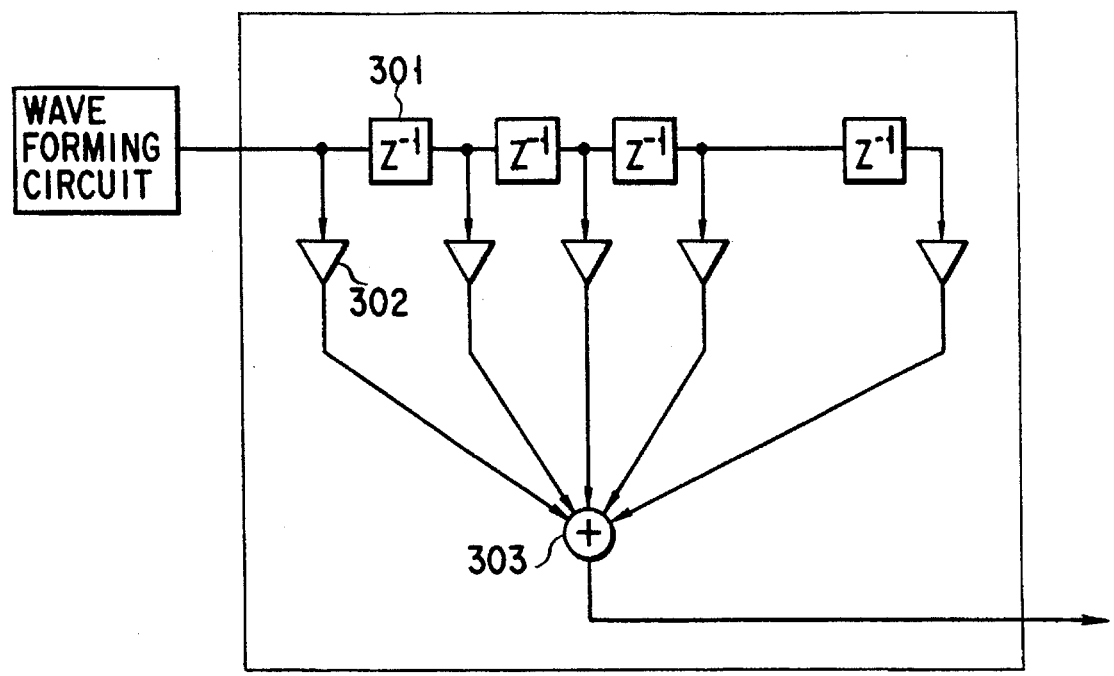
F I G. 33
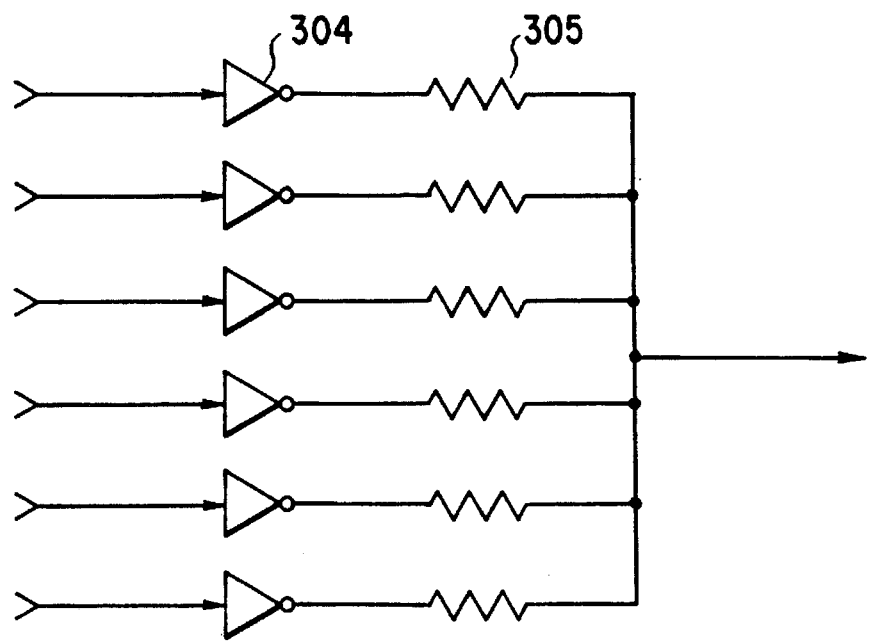
F I G. 34

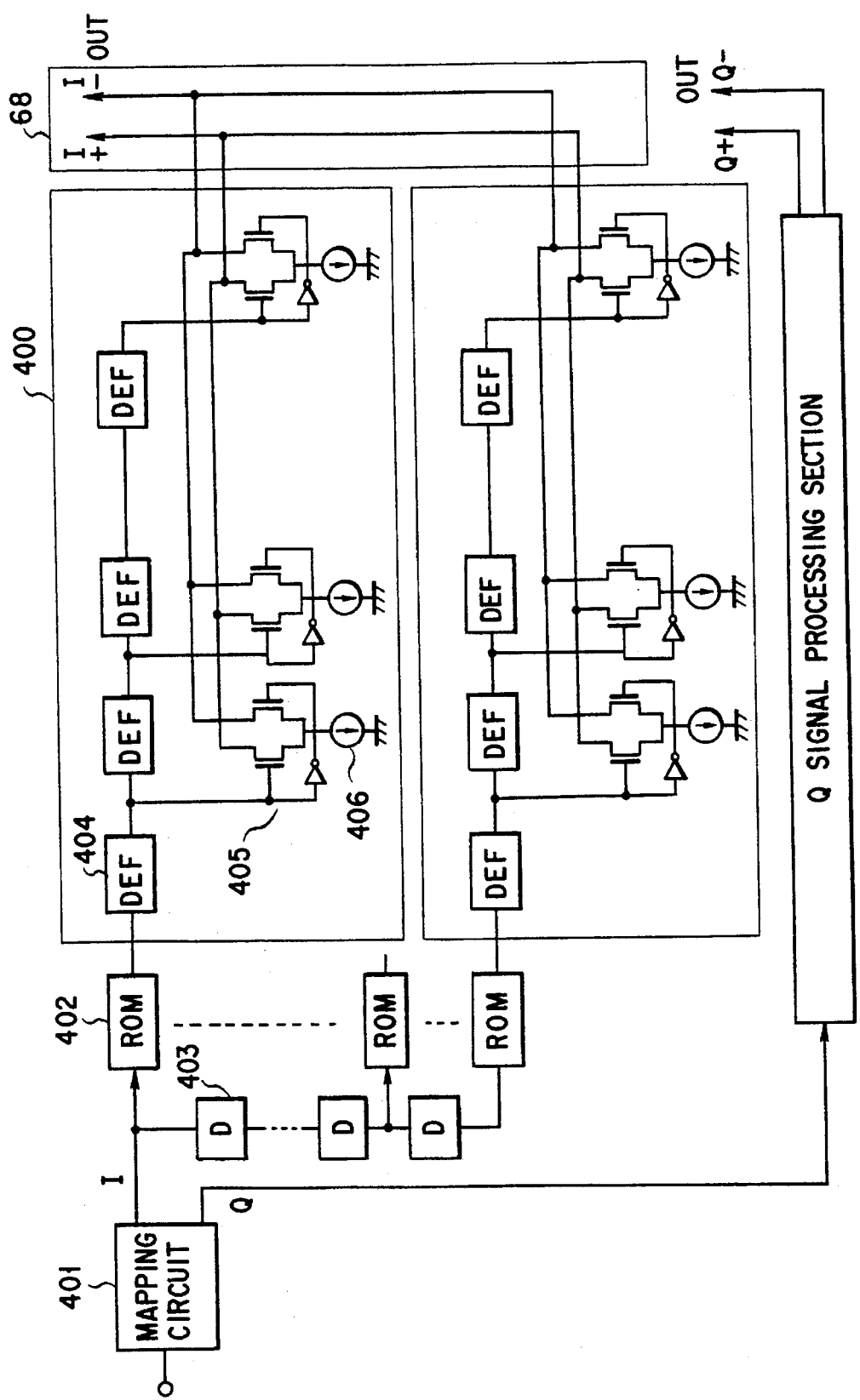
F I G. 36

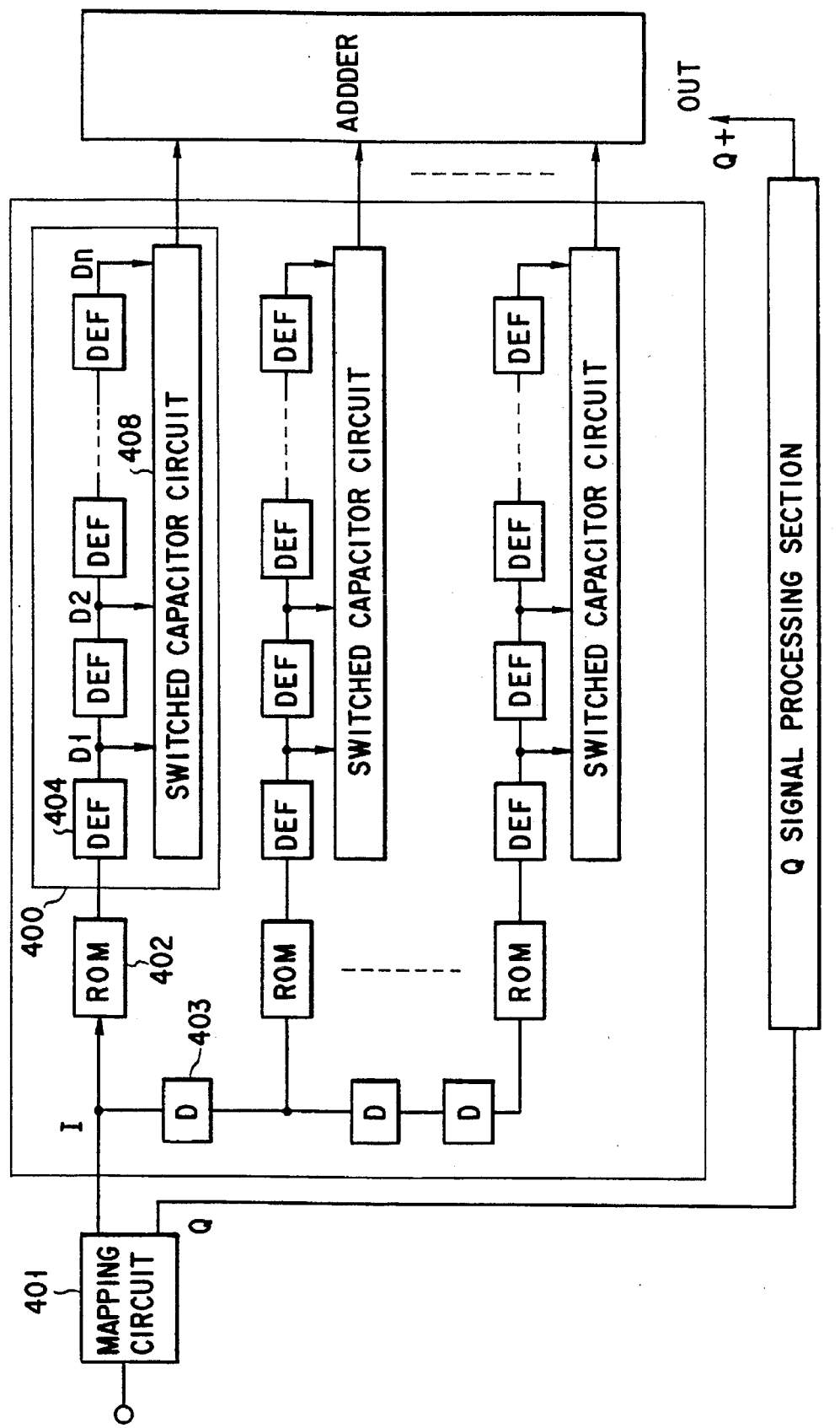
F I G. 37

EQUIPMENT FOR GENERATING A TRANSMIT SIGNAL FROM FIRST AND SECOND DIGITAL SIGNALS

CROSS-REFERENCE TO THE RELATED APPLICATIONS

This application is a continuation-in-part of U.S. patent application Ser. No. 08/143,064, filed Oct. 29, 1993.

BACKGROUND OF THE INVENTION

1. Field of the Invention

The present invention relates to a transmitting equipment and, more specifically, to a transmitting equipment using a QPSK (Quadrature Phase Shift Keying) signal generating apparatus.

2. Description of the Related Art

QPSK codes are used in a modulation system in which time-sequential data is divided into unit data strings and these unit data strings are converted into I-channel and Q-channel signals crossing each other at right angles, to express a state. With these codes, it is possible to express four states according to combinations of (I, Q) in the I, Q plane: for example, (0, 0), (1, 0), (0, 1), and (1, 1) (refer to RCR-SRD-27, the Radio System Development Center Foundation).

To generate such a QPSK signal, for example, QPSK signal generators have been used. Time-sequentially supplied digital signals are converted by a mapping circuit into QPSK codes expressed by I and Q signals. The mapping circuit outputs I and Q signals in synchronization with a specific clock and these signals are supplied to a digital roll-off filter to prevent interference between QPSK codes. The output of the digital roll-off filter is converted by a digital-to-analog converter into an analog signal, which is supplied to a low-pass filter to attenuate undesired frequency components. The output of the low-pass filter is the QPSK signal.

The digital roll-off filter is generally realized by an FIR (finite impulse response) or IIR (infinite impulse response) digital filter. These digital filters are made up of digital adders, digital multipliers, or digital delay elements. The scale of these digital circuits is generally large, which is an obstacle to making the QPSK signal generator more compact.

To avoid the obstacle, a method of constructing a QPSK signal generator without using a large digital roll-off filter has been proposed. This method can produce only four kinds of QPSK signals determined by combinations of (I, Q). Thus, by preparing the impulse responses of a digital roll-off filter which correspond to the input signals beforehand, instead of supplying in real time the QPSK signals converted at the mapping circuit to the digital roll-off filter, and only when the input is arrived, supplying the impulse response corresponding to the input signal, the function of the digital roll-off filter can be achieved.

In this case, in order to make the impulse response corresponding to the input signal approximate thereto in real time, the result of adding impulse responses of digital roll-off filters to the extent that an effect on the output signal is sufficiently small, is actually outputted. Because the impulse responses of the digital roll-off filter are bits of digital data, this causes the problem that a large digital adder is required to add these bits.

As mentioned above, when a digital roll-off filter is used, it is difficult to make the entire size of the QPSK signal generator smaller because the digital roll-off filter is composed of a large digital circuit. Also, if a signal generator uses no digital roll-off filter, since it requires an adder for digital data, it is not suitable for making the QPSK signal generator more compact.

As described above, conventional QPSK signal generators need large digital filters. In the case where the function is modified without using digital filters, a large digital adder is required, too. To improve the accuracy of signal, it is necessary to use high-accuracy elements for D/A converter components.

SUMMARY OF THE INVENTION

An object of the present invention is to provide a transmitting equipment which includes a QPSK signal generating apparatus but uses neither digital filters nor digital adders and needs no high-accuracy components.

According to a first aspect of the present invention, there is provided a transmitting equipment comprising:

a signal conversion circuit for converting a time-series input signal into first and second time-series digital signals;

a signal holding circuit for dividing the first and second time-series digital signals from the signal conversion circuit into a plurality of first and second digital signals, holding the plurality of first and second digital signals, and outputting the plurality of first and second digital signals in parallel;

a waveform forming circuit for outputting a plurality of first and second waveform forming data items corresponding to the plurality of first and second digital signals, output from the signal holding circuit, respectively;

a D/A conversion circuit for converting the plurality of first and second waveform forming data items output from the waveform forming circuit into a plurality of first and second analog signals;

an addition circuit for adding the plurality of first and second analog signals from the D/A conversion circuit and outputting first and second sum signals;

a filter circuit for removing high-frequency components from the first and second sum signals output from the addition circuit; and an orthogonal modulation circuit for orthogonally modulating the first and second sum signals.

According to a second aspect of the present invention, there is provided a transmitting equipment comprising:

a holding circuit for dividing a time-series digital signal into a plurality of first and second digital signals, holding the plurality of first and second digital signals, and outputting the plurality of first and second digital signals in parallel;

a waveform forming circuit, including a memory circuit for storing a plurality of oversampling codes corresponding to the plurality of first and second digital signals output from the holding circuit, for reading the oversampling codes out of the memory circuit and outputting the oversampling codes as first and second waveform forming signals;

a modulation circuit for modulating the first and second waveform forming signals output from the waveform forming circuit and outputting first and second modulated signals;

an addition circuit for adding the first and second modulated signals output from the modulation circuit and outputting first and second sum signals;

a filter circuit for removing high-frequency components from the first and second sum signals output from the addition circuit; and a transmitting signal generation circuit for adding the first and second sum signals from which the high-frequency components are removed by the filter circuit, and generating a transmitting signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a block diagram of a signal generating apparatus according to a second embodiment of the present invention;

FIG. 5 is a block diagram of a signal generating apparatus according to a third embodiment of the present invention;

FIG. 6 is a block diagram of a signal generating apparatus according to a forth embodiment of the present invention;

FIG. 7 is a block diagram of a signal generating apparatus according to a fifth embodiment of the present invention.

FIG. 14 shows a waveform of an impulse response;

FIG. 15 is a block diagram of a signal generating apparatus according to a ninth embodiment of the present invention;

FIG. 16 is a block diagram of a signal generating apparatus according to a tenth embodiment of the present invention;

FIG. 18 shows a noise shaping characteristic;

FIGS. 22A and 22B are block diagrams showing the main parts of a transmitting equipment using a modulated signal generating apparatus according to a fifteenth embodiment of the present invention;

FIG. 23 is a circuit diagram showing an example of a current output-type D/A converter;

FIG. 24 is a circuit diagram showing another example of a current output-type D/A converter;

FIG. 25 is a circuit diagram showing the main part of a modulated signal generating apparatus used in a transmitting equipment according to a sixteenth embodiment of the present invention;

FIG. 26 is a block diagram showing the main part of a modulated signal generating apparatus used in a transmitting equipment according to a seventeenth embodiment of the present invention;

FIG. 27 is a circuit diagram of the arrangement of an address generator of FIG. 26;

FIG. 28 is a block diagram of the main part of a modulated signal generating apparatus used in a transmitting device according to an eighteenth embodiment;

FIG. 29 is a view of the formation of data stored in a ROM of the device shown in FIG. 28;

FIG. 30 is a block diagram showing the main part of a modulated signal generating apparatus used in a transmitting equipment according to a nineteenth embodiment of the present invention;

FIG. 31 is a block diagram showing the main part of a modulated signal generating apparatus used in a transmitting equipment according to a twentieth embodiment of the present invention;

FIG. 32 is a block diagram showing the main part of a modulated signal generating apparatus used in a transmitting equipment according to a twenty-first embodiment of the present invention.

FIG. 33 is a block diagram showing the main part of a modulated signal generating device according to a twenty-second embodiment of the present invention;

FIG. 34 is a circuit diagram of an FIR filter of the device shown in FIG. 33;

FIG. 36 is a block diagram showing the main part of a modulated signal generating device according to a twenty-third embodiment of the present invention;

FIG. 37 is a block diagram showing the main part of a modulated signal generating device according to a twenty-fourth embodiment of the present invention;

DETAILED DESCRIPTION OF THE PREFERRED EMBODIMENTS

Figure 1:
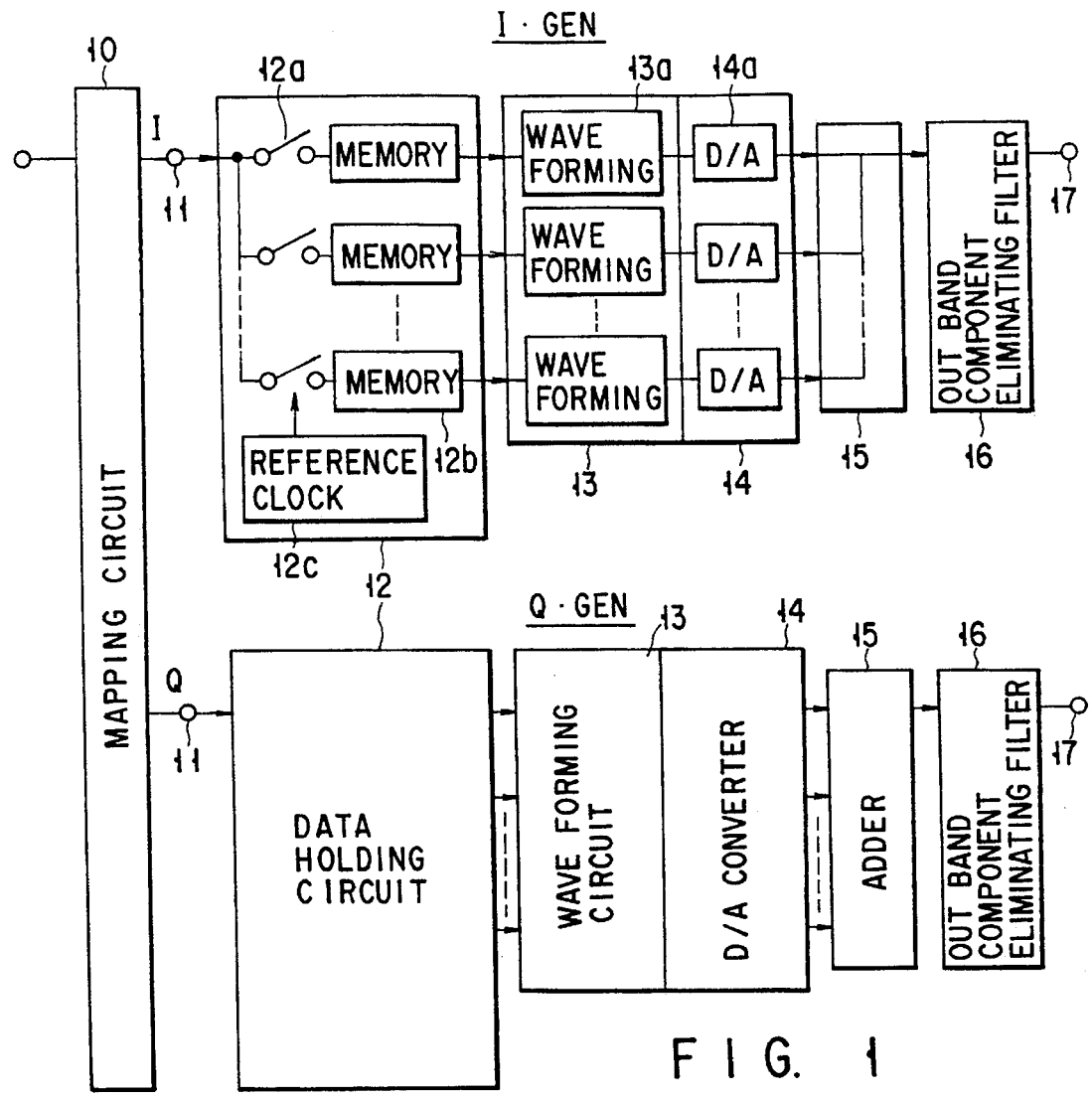
FIG. 1 is a block diagram of a signal generating apparatus according to a first embodiment of the present invention.

In a first embodiment of the present invention shown in FIG. 1, a mapping circuit 10 converts the supplied time-sequential digital signal into QPSK codes made up of I and Q signals. The I output terminal and Q terminal of the mapping circuit 10 are connected to an I-and Q-channel signal generators I-GEN and Q-GEN, respectively. The I-and Q-channel signal generators have the same circuit configuration. In this embodiment, a detailed explanation of the I-channel signal generator I-GEN will be given.

Figure 2:
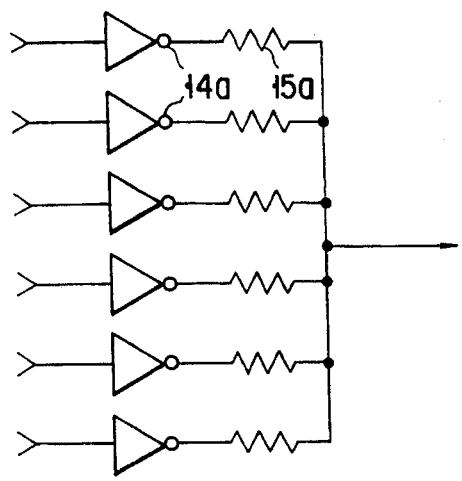
FIG. 2 is a circuit diagram of a current type D/A conversion circuit.

A signal input terminal 11 is connected to the input terminal of a data holding circuit 12 that retains the input data. The data holding circuit 12 comprises a plurality of switches 12a connected to the signal input terminal 11, a reference clock generator 12c that produces a reference clock signal to actuate the switches 12a in sequence, and a plurality of memories 12b connected to the switches 12a, respectively. The output terminals of the data holding circuit 12 are connected to the input terminals of a waveform forming circuit section 13 including a plurality of waveform forming circuits 13a that form the waveform of each piece of data supplied from each memory 12b. The output terminals of the plurality of waveform forming circuits 13a in the waveform forming circuit section 13 are connected to a plurality of D/A converters 14a of a D/A conversion circuit 14, respectively. The output terminals of the D/A converters 14a are connected to an out band component eliminating circuit 16 via an adder circuit 15. The D/A conversion circuit 14 and adder circuit 15 are constructed by inverters 14a and resistors 15a, respectively, as shown in FIG. 2. The outband component eliminating circuit 16 removes high-frequency components from the impulse-response analog addition result signal outputted from the adder circuit 15, and supplies an output signal at an output terminal 17.

With the signal generating apparatus thus constructed, in the data holding circuit 12, the inputted I (and Q) signal is supplied via the switch 12a, which is switched by a select signal from the reference clock circuit 12c, to the memory 12b with a state holding function such as a latch or a flip-flop, which stores the signal. The waveform forming circuit 13 stores the impulse response corresponding to the impulse response of the digital roll-off filter and outputs the impulse response corresponding to the signal transferred from the data holding circuit 12. The D/A conversion circuit 14 converts the digital impulse responses into analog signals. After the analog adder 15 adds the analog signals and outputs a sum signal, the outband component eliminating circuit 16 removes high-frequency components from the sum signal and supplies a QPSK signal at the output terminal 17.

Because in a conventional signal generating apparatus, digital addition was performed in a stage prior to the A/D conversion circuit to add finite impulse responses, a digital adder was required. This made the scale of the circuit larger and consequently it was impossible to make the entire signal generator smaller. With the present invention, however, the adder 15 can be formed of an analog adder, making it possible to render the circuit scale far smaller than that of a digital adder. Accordingly, it is possible to make the circuit scale of the QPSK signal generating apparatus smaller.

When the arrangement of the D/A conversion circuit 14 and the analog adder 15 is modified and the analog data converted by each D/A converter 14a is expressed as a current value, the current outputs from the converters 14a can be added by connecting the output lines of the D/A converters 14a. Thus, the analog adder can be practically eliminated, thereby making it possible to further simplify the arrangement of the QPSK signal generating apparatus. Instead of using a current output-type converter as a D/A converter, the output of a voltage output-type D/A converter may undergo voltage-to-current conversion.

In the data holding circuit 12 of FIG. 1, the switches 12a are switched by a reference signal generated at the reference clock circuit 12c and the input signal is stored time-sequentially in the memories 12b, which convert the time-sequential data into parallel data. The converted data is supplied from the data holding circuit 12.

Figure 3:
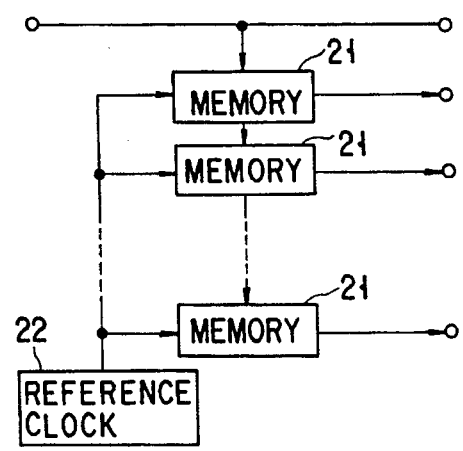
FIG. 3 is a circuit diagram of the data holding circuit of the signal generating apparatus in FIG. 1.

In a modification of the data holding circuit of FIG. 3, there are a plurality of memories 21 connected in series, and data is transferred from a memory to an adjacent memory each time a clock pulse arrives from the reference clock circuit 22. By transferring data from each of the memories 21, the time-sequential data is converted into parallel data. Therefore, the memory 21 functions as a delay element for the input signal, holds the time-sequential data, and converts the time-sequential data into parallel data. Accordingly, the memories 21 can be used as a data holding circuit.

When the data holding circuit of FIG. 3 is used, the arrangement of the waveform forming circuit section 13 is modified as follows. In the QPSK signal generating apparatus of FIG. 1, the waveform forming circuit section 13 stores the digital data almost corresponding to the impulse response of the digital roll-off filter.

Because the time-sequential data stored during a certain period of time is transferred in unison from the data holding circuit of FIG. 3, it is necessary to store the impulse response to each code of the QPSK signal in the waveform forming circuit section 13. Since the impulse responses to the input signal train contain portions overlapping each other in terms of time, the impulse responses are divided along the time axis and the data items corresponding to the divided components are stored in the waveform forming circuits 13a, respectively. The waveform forming circuits 13a transfer the signal corresponding to each data item according to the QPSK signal input. Because these data items are digital signals as in FIG. 1, they undergo a similar process as that performed on the signal in FIG. 1, and are converted by the D/A conversion circuit 14 into analog signals. The QPSK analog signals from the D/A converters 14a are added by the analog adder 15 and the addition result is supplied to the outband component eliminating circuit 16. The outband component eliminating circuit 16 removes outband components from the added signal and sends the output signal.

Referring to FIG. 4, a third embodiment of the present invention will be described.

With this embodiment, the input signal is converted by a mapping circuit 10 as shown in FIG. 1 into a QPSK signal, which is then supplied to an address circuit 31 through an I channel and a Q channel separately. The address circuit 31 is connected to a ROM 32 and generates an address signal according to the input signal. The ROM 32 stores the impulse response according to the input signal and reads the impulse response according to the address signal corresponding to the input signal. Specifically, the address circuit 31 comprises a shift register 36 formed of a plurality of delay elements 35 connected in series and an address conversion circuit (counter) 37 as shown in FIG. 5. When a mapping signal is supplied to the first-stage delay element 35, the address conversion circuit 36 outputs an address signal in accordance with the signals stored in the individual delay elements 35. The ROM 32, when receiving the address signal corresponding to the input signal, outputs an impulse response to the A/D converter 33. The address conversion circuit 37 generates an address signal in synchronization with the clock signal.

The QPSK output signal is expressed as the sum of the impulse responses corresponding to the impulse responses of the digital roll-off filter to the input signals. In this embodiment, the ROM 32 stores the signal of the sum (superposition) of the impulse responses according to each combination of QPSK signals. The contents of the ROM 32 are read in accordance with the address signal from the address circuit 31. This enables the data holding circuit 12 as shown in FIG. 1 to be constructed of a single ROM 32. The signal from the ROM 32 is converted by the D/A converter 33 into an analog signal, from which unwanted frequency components are removed. Then, the resulting signal is outputted as a QPSK signal.

A fourth embodiment of the present invention will be described with reference to FIG. 6.

The input signal has been converted by a mapping circuit (not shown) into a QPSK signal, which is then supplied to an address circuit 41. The address circuit 41 generates a plurality of address signals to reproduce a signal upon which the impulse responses according to the QPSK signal train supplied have been superposed. A ROM 42 stores the data on the impulse responses to be supplied to a plurality of D/A converters 45. Each memory element 44 (for example, each latch) of a data holding circuit 43 retains the data on the impulse responses read from the ROM 42 in accordance with the QPSK signal train supplied. The data items of impulse response which are specified by the address circuit 41 are read from the memory elements 44 and are then converted into analog signals. The converted signals are added to produce a signal upon which the impulse response data is superposed.

According to the fourth embodiment of FIG. 6, the memory capacity of the ROM 42 may be equal to the memory capacity required for the first embodiment, because a plurality of impulse response data items can be stored in a single ROM by switching addresses. Since such structure does not require to make each impulse response correspond to a ROM, the memory capacitor of the ROM can be effectively utilized.

In this case, each of the memory elements 44 stores only the impulse response corresponding to the QPSK signal train supplied, which can be read in response to the clock signal. It is possible to obtain and store a ROM table corresponding to a plurality of impulse responses, and selectively output an impulse response according to the addressing. Further, while in this embodiment, the memory elements 44 are provided to store the data retained in the ROM 42, the memory elements 44 may be arranged so as to store the input signal train or to store the analog data after D/A conversion.

A fifth embodiment of the present invention will be described, referring to FIG. 7.

The input signal is converted into a QPSK signal by a mapping circuit (not shown). In a data holding circuit 51, the QPSK signal is stored in sequence in the memories 51b via switches 51a sequentially switched by the reference clock from a reference clock circuit 51c. A waveform forming circuit section 52 is controlled by the QPSK signal supplied. In the waveform forming circuit section 52, the impulse response subjected to filtering at an intercode interference eliminating filter and corresponding to the QPSK signal is modulated by an oversampling modulator represented by a $\Delta\Sigma$ modulator (refer to Akira Yukawa, "Oversampling A-D conversion technology," Nikkei BP Company) and is stored in each memory element in the form of a signal of a single bit or several bits in accordance with each QPSK signal.

The oversampling code is a code which can reduce the quantizing noise in the band by oversampling and noise shaping and express in-band signals at high accuracy in spite of the fact it is a single bit code. Therefore, by storing the above-described signal in the memory elements in the waveform forming circuit section 52, the circuit scale of the D/A converter 53 in the next stage is decreased remarkably. In addition to this, use of still another single-bit code provides a greater effect.

Namely, use of single-bit codes not only reduces the circuit scale because the code length of the D/A conversion circuit 53 is one bit, but also enables the D/A conversion circuit 53 to be formed of only switch elements, thus eliminating requirements for element accuracy. This makes it possible to construct a QPSK signal generating apparatus on an LSI easily. Further, use of oversampling codes alleviates the requirements for element accuracy for the filter 55, thereby reducing the circuit scale of the D/A conversion circuit 53 remarkably.

In this embodiment, the D/A conversion circuit 53 is of the current output type and the analog adder 54 is realized by connection of the output lines. This makes the analog adder 54 unnecessary. Because the output signal is a current, the filter 55 may be of the current input type. After the current output signal is converted into a voltage by a current-to-voltage circuit, the voltage may be supplied to the filter 55, which supplies an output.

Because the oversampling modulator used in this embodiment is of the voltage output type and outputs an analog signal, the circuit configuration can be made much smaller than that with a digital adder even if an analog adder is provided.

The data holding circuit 51 of FIG. 7 may be substituted by the data holding circuit shown in FIG. 3, provided that the data to be stored in the ROM differs depending on the type of holding circuit for the input data. When the data holding circuit 51 of FIG. 7 is used, the data obtaining by oversampling part of the result of multiplying the impulse response by a certain duration of window is stored in the ROM. In contrast to this, when the data holding circuit of FIG. 3 is used, the data obtained by oversampling the impulse response of the digital roll-off filter is stored in the ROM.

While in the above embodiment, four-phase QPSK signals are used, two-phase or eight-phase QPSK signals may be applied to the invention. The invention can be operated as a signal generator regardless of signal form.

A sixth embodiment will be described with reference to FIG. 8.

In this embodiment, an input terminal 61 to which a digital signal is supplied is connected to the input terminal of a mapping circuit 62. The I and Q signal output terminals of the mapping circuit 62 are connected to the input terminals of I and Q signal processing sections 63a and 63b, respectively. The I signal processing section 63a comprises a plurality of delay elements 64 connected in series to sequentially delay I signal from the mapping circuit 62, a plurality of ROMs 65, one of which is connected to the I signal output terminal of the mapping circuit 62 and the others of which are connected to the output terminals of delay elements 64, a plurality of D/A converters 66 connected to the output terminals of these ROMs 65 respectively, a plurality of weighting circuits 67 connected to the output terminals of these D/A converters 66 respectively, an adder 68 connected to the output terminals of these weighting circuits 67, and an outband component eliminating filter 69 connected to the output terminal of the adder 68. The Q signal processing section 63b has the same circuit configuration as that of the I signal processing section 63a.

Figure 8:
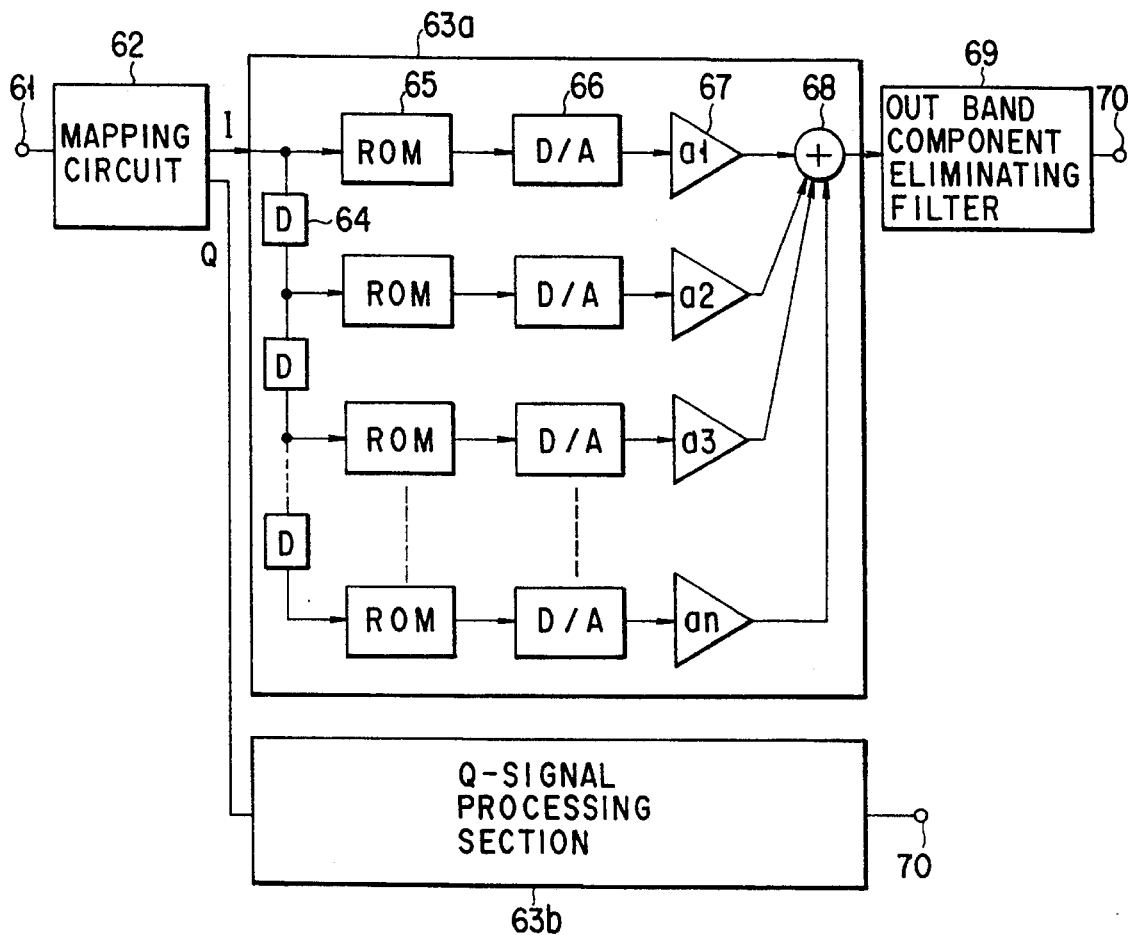
FIG. 8 is a block diagram of a signal generating apparatus according to a sixth embodiment of the present invention.
Figure 9:
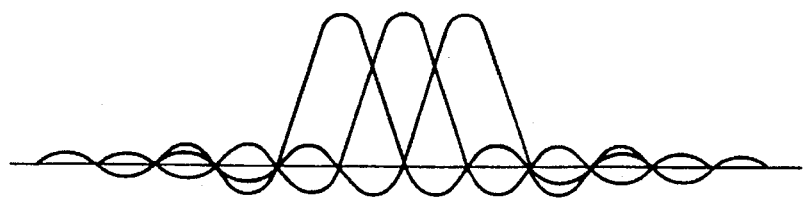
FIG. 9 shows a waveform of a impulse response.

In the sixth embodiment of FIG. 8, the digital signal supplied to the input terminal 61 is converted by the mapping circuit 62 into a QPSK signal made up of an I and Q signals. The ROMs 65 store the impulse responses corresponding to each code of the QPSK signal. The impulse responses to the input signal train contain overlapping portions as shown in FIG. 9. Because of this, the impulse responses are divided and stored in the ROMs 65 separately. That is, the QPSK signal is delayed by the delay elements 64 in sequence to produce divided QPSK signals, which are then stored in the plurality of ROMs 65 separately.

The output digital signals from these ROMs 65 are converted by the D/A converters 66 into analog signals and are multiplied by specified weights respectively at the weighting circuits 67. The weighted analog signals from the weighting circuits 67 are added by the adder 68. The added analog signal is supplied to the outband component eliminating filter 69, which removes unwanted signal components and supplies an QPSK signal at the output terminal 70.

In this embodiment, the weight value of the weighting circuit 67 is varied according to the output waveform shown in FIG. 9. Specifically, where the amplitude is small, a small weight value $\alpha_n$ is set. In contrast, where the amplitude is great, a large weight value $\alpha_n$ is set. By multiplying the data stored in the ROM 65 by $1/\alpha_n$ (weight value) according to such a rule, the effect of quantizing noise can be reduced.

Figure 10:
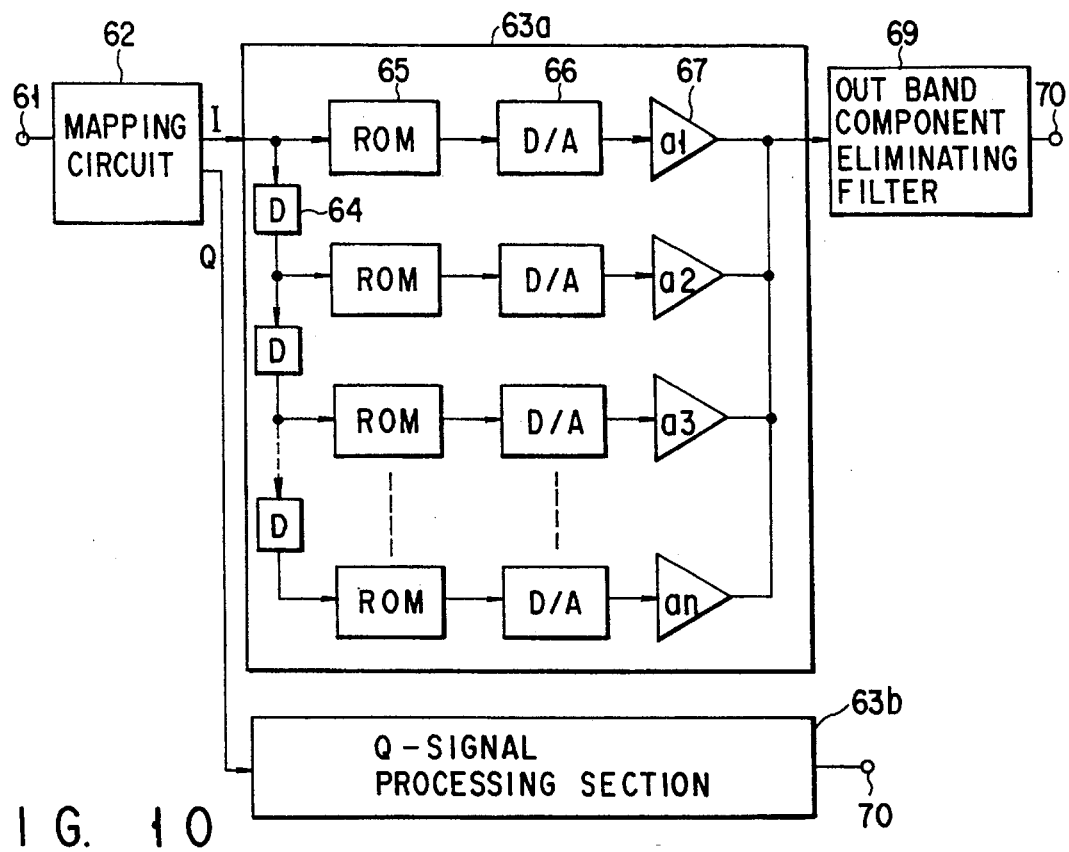
FIG. 10 is a block diagram of a signal generating apparatus according to a seventh embodiment of the present invention.

FIG. 10 shows a seventh embodiment of the present invention. In the seventh embodiment, a current output-type D/A converter is used as the D/A converter 66. The current outputs of these D/A converters 66 are connected with wires to form an adder. That is, use of current-type D/A converters eliminates the adder 68 of the sixth embodiment of FIG. 8, and wire connection of the outputs of D/A converters functions as an adder. This makes it possible to make the circuit scale of the analog adder. While in this embodiment, the D/A converter is of the current output type, the output of a voltage output-type D/A converter may undergo voltage-to-current conversion.

Figure 11:
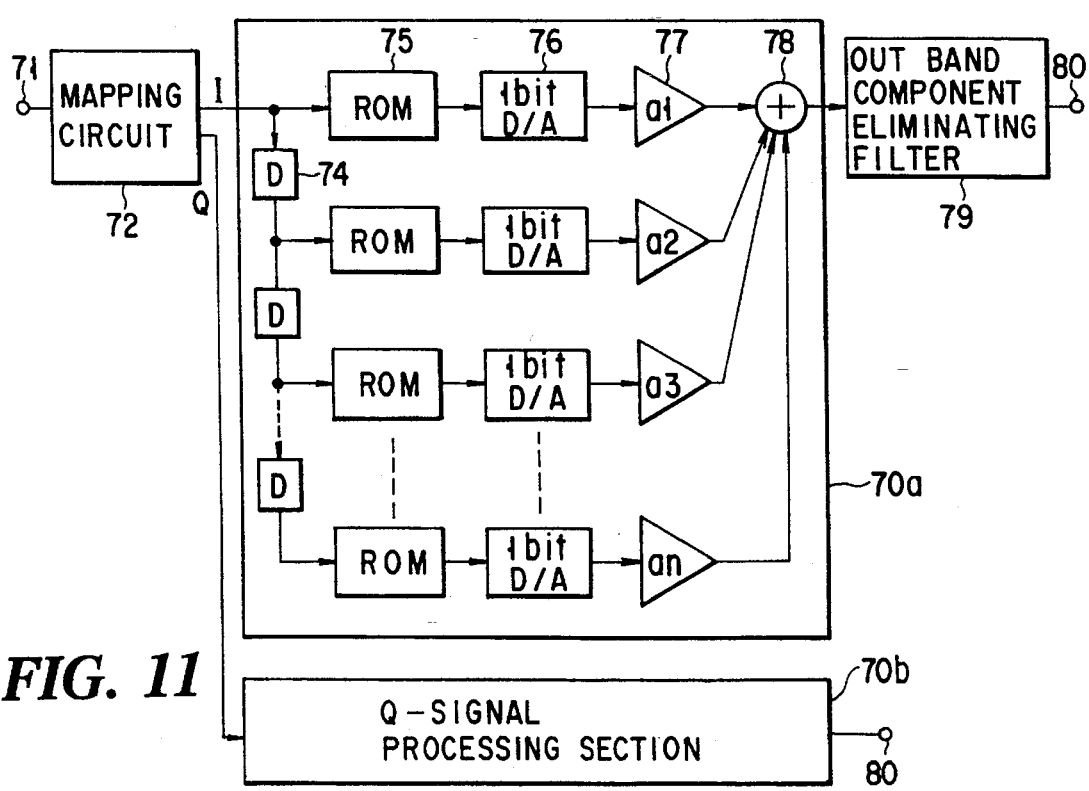
FIG. 11 is a block diagram of a signal generating apparatus according to an eighth embodiment of the present invention.
Figure 12:
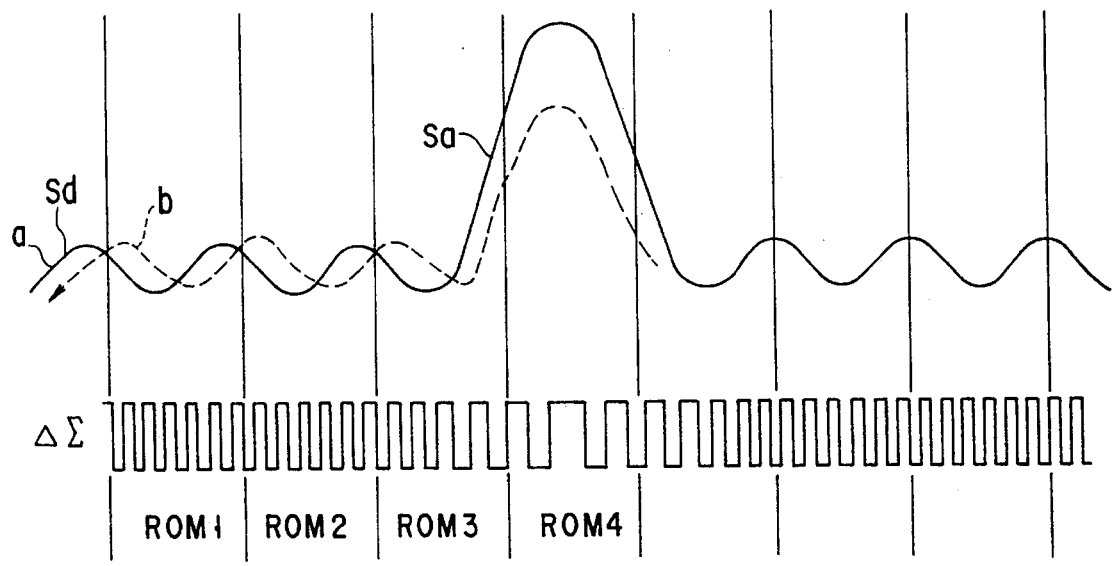
FIG. 12 shows an impulse response and a $\Delta\Sigma$ signal.
Figure 13:
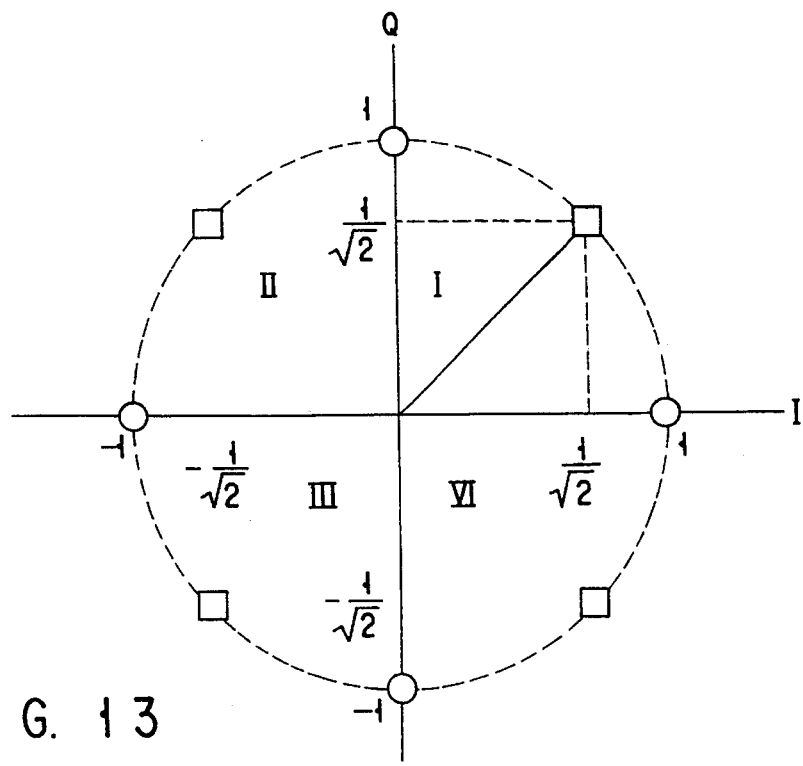
FIG. 13 shows an IQ plane.

FIG. 11 shows an eighth embodiment of the present invention. In this embodiment, the input signal supplied to an input terminal 71 is converted by a mapping circuit 72 into a QPSK signal. The QPSK signal directly controls ROMs 75 via delay elements 74. The ROMs 75 correspond to the QPSK signals, respectively, and each store signals of one bit or several bits obtained by modulating the impulse response from an intercode interference eliminating filter with an oversampling modulator (refer to Akira Yukawa "Oversampling A-D conversion technology," Nikkei BP Company) represented by a $\Delta\Sigma$ modulator. Specifically, the output waveform Sa shown in FIG. 12 is divided into pieces and the divided portions Sd are converted into $\Delta\Sigma$ data items, which are stored in the ROMs 75. Each ROM 75 has five memory areas corresponding to values on the I axis of the IQ plane shown in FIG. 13, that is, 1, $1/\sqrt{2}$, 0, $-1/\sqrt{2}$, and $-1$. These memory areas are addressed by I signal and the $\Delta\Sigma$ data item corresponding to I signal input is read out.

By storing such signals in the ROMs 75, the circuit scale of the D/A converter is reduced remarkably. Use of single-bit codes decreases the circuit scale much more. Specifically, when single-bit codes are used, the code length of the D/A converter 76 is one bit. This not only reduces the circuit scale but also allows the D/A converter 76 to be formed of switch elements only, thereby eliminating requirements for element accuracy. Because of this, the QPSK signal generator can be constructed on an LSI easily. Further, use of oversampling codes alleviates the requirements for the performance of the filter 79. In this embodiment, the weight value $\alpha_n$ of the weighting circuit 77 is varied according to the output waveform. Specifically, where the amplitude is small, the weight value $\alpha_n$ is made small. In contrast, where the amplitude is large, the weight value $\alpha_n$ is made large. By multiplying the data stored in ROMs 75 by $1/\alpha_n$ according to such a rule, the effect of quantization can be decreased. The output waveform of one impulse response at that time has an amplitude having a stepwise envelope as shown in FIG. 14. As seen from the figure, the quantizing noise in the signal subjected to $\Delta\Sigma$ modulation can be reduced remarkably.

FIG. 15 shows a ninth embodiment of the present invention. In this embodiment, a D/A converter 76 is of the current output type and the adder in the eighth embodiment is replaced with the connection of the 10 output lines of the D/A converters 76. Therefore, the circuit scale of this embodiment is smaller than that of the eight embodiment. Because the output signal is a current, the filter 79 may be of the current type. After the output signal is converted by a current-to-voltage converter into a voltage, the voltage may be supplied to a voltage-type filter.

With the signal generating apparatuses described above, quantization noise in the band can be reduced by noise shaping. From a different point of view, however, this means that noise outside the band increases. Thus, interference with other signals may become a problem. In this connection, a tenth embodiment capable of decreasing an adverse effect on other signals will be described in conjunction with FIGS. 16 to 18.

Briefly, by constructing a signal generating apparatus using an oversampling-type converter with such a noise shaping characteristic as suppresses the noise level in a specific frequency band, the level of unwanted noise in the specific frequency band can be suppressed, thereby alleviating the requirements for outband blocking filters.

According to the circuit construction shown in FIG. 16, a digital signal supplied to an input terminal 81 is converted by a mapping circuit 82 into a QPSK signal made up of I and Q signals. Because I and Q signals are processed in the same way, only the processing of the I signal will be explained. ROMs 85 store the impulse responses to each code of a QPSK signal, respectively. The impulse responses to an input signal train contain portions overlapping each other as shown in FIG. 9. Thus, the impulse responses are divided and stored in the ROMs separately. Delay elements 84 are used so that the QPSK signal may be supplied correctly to each ROM 85. The output digital signals from the individual ROMs are converted by D/A converters 86 into analog signals. The analog signals are added by an analog adder 88. The addition result is supplied to an outband component eliminating filter, which supplies an output signal.

In a conventional signal generating apparatus, the above addition was carried out digitally in a stage prior to the D/A converter, resulting in the larger circuit scale. With this invention, the adder is realized by an analog adder, whose circuit scale is smaller than that of a digital adder. This makes it possible to reduce the circuit scale of a QPSK signal generator.

Figure 17:
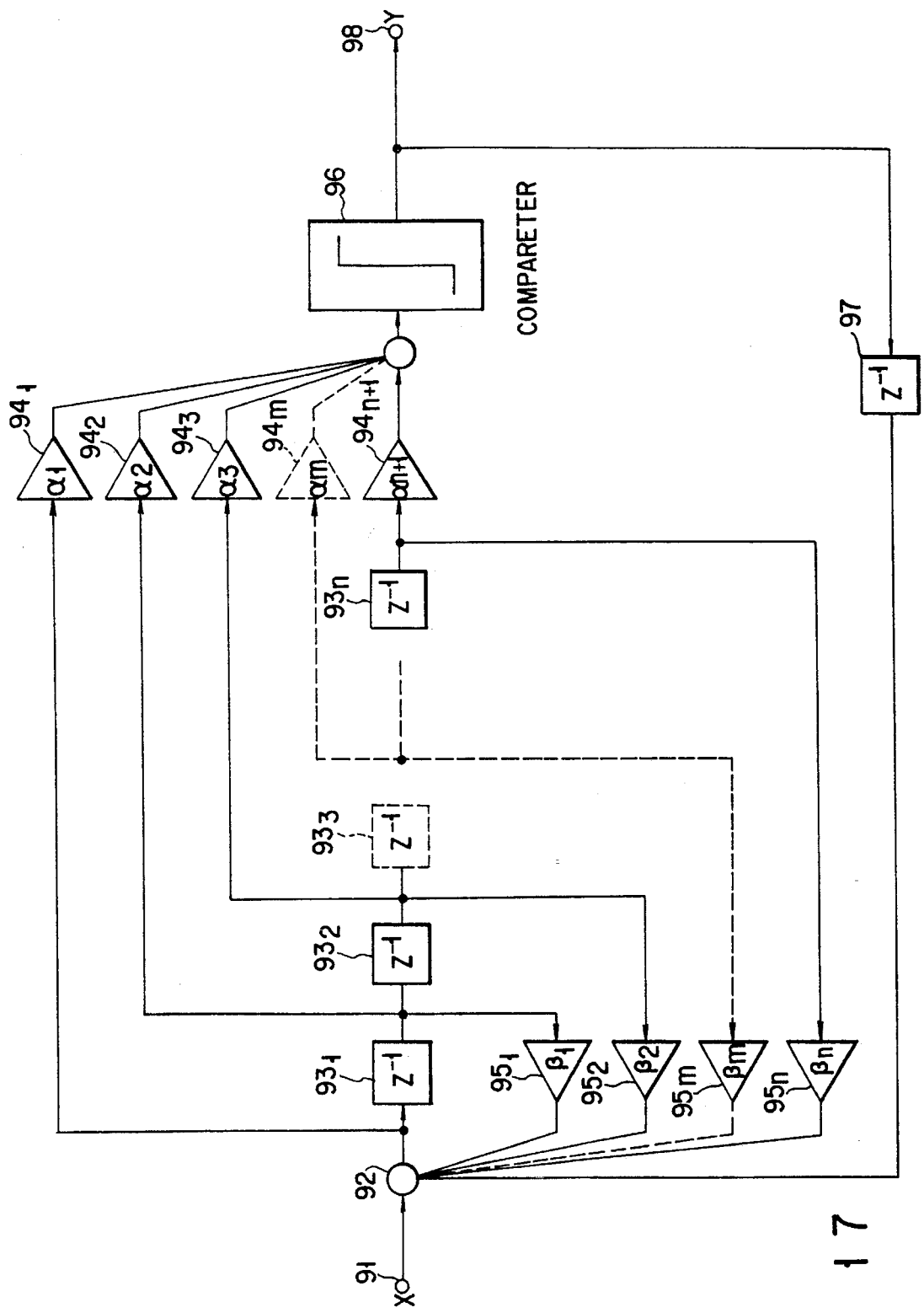
FIG. 17 is a circuit diagram of a n-th order $\Delta\Sigma$ modulator.

In the ROMs 85 of the signal generating apparatus of FIG. 16 are data items obtained by modulating a root roll-off signal by means of a ΔΣ modulator. The ΔΣ modulator comprises an adder 92 connected to an x input terminal 91, a plurality of delay circuits, i.e., $z^-$ circuits 93$_1$ to 93$_n$ connected in series, a plurality of α-coefficient circuits 94$_1$ to 94$_{n+1}$, a plurality of β-coefficient circuits 95$_1$ to 95$_n$, an adder 96, a comparator 97, and a delay circuit i.e., $z^{-1}$ circuit 98 as shown in FIG. 17.

The adder 92 adds the input signal, i.e., root roll-off signal, the output signals from β-coefficient circuits 95$_1$ to 95$_n$, and the $z^{-1}$ circuit 98, and supplies a sum signal to the first stage $z^{-1}$ circuit 93$_1$ and α-coefficient circuits 94$_1$. The $z^{-1}$ circuit 93$_1$ delays the sum signal by a predetermined time and supplies the delay signal to the next stage $z^{-1}$ circuit 93$_2$. That is, $z^{-1}$ circuit 93$_1$ to $z^{-1}$ circuit 83$_n$ delay the sum signal in turn and output respective delay signals. The α-coefficient circuits 94$_1$ multiplies a coefficient $α_1$ to the sum signal, and the α-coefficient circuits 94$_2$ to 94$_{n+1}$ multiply coefficients $α_2$ to $α_{n+1}$ to the output signals from the $z^{-1}$ circuits 93$_2$ to 93$_n$, respectively. The output signals from the α-coefficient circuits 94$_1$ to 94$_{n+1}$ are added by the adder 96. The sum signal from the adder 96 is supplied to the comparator 97 to compares with a threshold value. The output signal of the comparator 97 is transferred to a y output terminal 99 and the $z^{-1}$ circuit 98. The β-coefficient circuits 95$_1$ to 94$_n$ multiply coefficients $β_1$ to $β_n$ to the output signals from the $z^{-1}$ circuits 93$_1$ to 93$_n$, respectively. The output signals from the α-coefficient circuits 95$_1$ to 95$_n$ and the output signal from the $z^{-1}$ circuit 98 are added by the adder 92.

The above ΔΣ modulator is given such a noise shaping characteristic as to suppress noise at a frequency at which interference should be prevented as shown in FIG. 18. In order to obtain the characteristic, a transfer function from x-input to y-output is assumed to be expressed as:

$$y=a(z)x+b(z)Q$$

where Q is quantizing noise generated at a quantizer.

In the above equation, by setting α and β so that b(z) may have a zero at a frequency at which interference should be prevented, the above noise shaping characteristic can be achieved. For example, to set two zeros at fs/m in the case of a forth-order ΔΣ modulator, α and β only have to be set so as to give:

$$b(z)=(1-z^{-1})^2(1-2\cos(π/m)z^{-1}+z^{-2})$$

FIG. 18 shows a noise shaping characteristic with a zero at 600 kHz. As seen from the figure, noise is reduced in the vicinity of a frequency of 600 kHz at which interference will occur. In a conventional signal generator, it was necessary to suppress this noise sufficiently with a filter in the rear stage. With the present invention, requirements for the characteristics of filters can be relaxed, which is helpful in making the system more compact.

The eleventh embodiment is constructed by connecting coefficient circuits 87 shown by dashed lines to the output terminals of the D/A converters 87 of the tenth embodiment, respectively. With this arrangement, the noise characteristic can be improved further by making the amplitude at the D/A converter small to reduce the quantizing noise itself where the amplitude of the response of the roll-off filter is small.

The arrangement using the converter whose noise shaping characteristic is improved as described above can be applied similarly to the embodiments shown in FIGS. 1, 4, 5, 6, 7, 8, 10, 11, and 15.

While in the above embodiments, QPSK signal generating apparatuses are used, the present invention is not limited to this type of signal generating apparatus, but may be applied regardless of the signal type.

The present invention does not require a large digital adder traditionally needed, thereby reducing the circuit scale. Further, with the invention, use of current output-type D/A converters enables not only the reduction of the circuit scale but also the remarkable alleviation of requirements for accuracy of circuit elements. This makes it easier to form signal generators on VLSIs, resulting in an improved yield and consequently a reduction in the production cost.

Transmitting equipment utilizing the foregoing signal generating apparatus, i.e., signal generator, will now be described.

Figure 19:
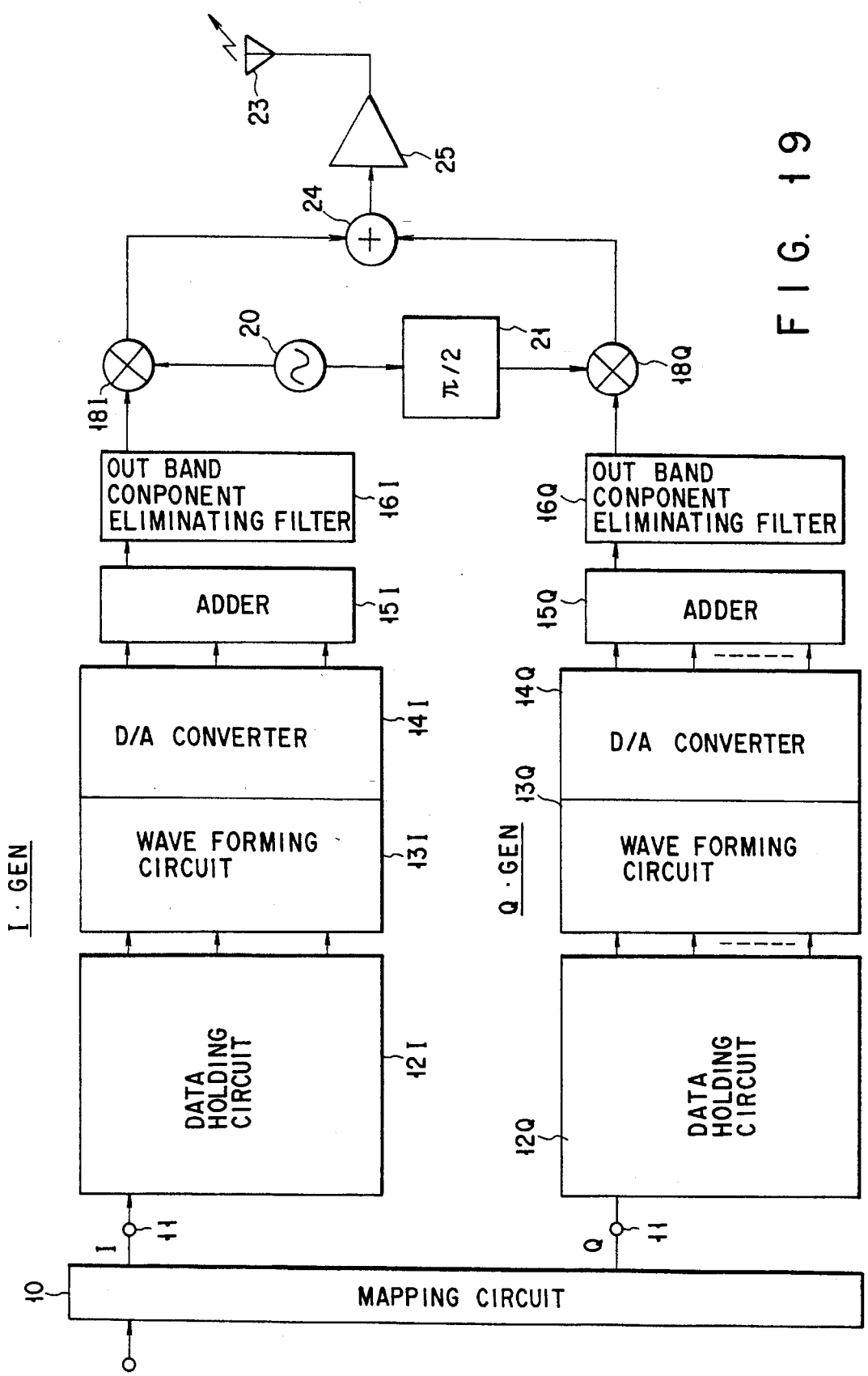
FIG. 19 is a block diagram of a transmitting apparatus using a modulated signal generating apparatus according to a twelfth embodiment of the present invention.

First FIG. 19 shows a transmitting equipment using the signal generator of FIG. 1 according to the twelfth embodiment of the present invention. Referring to FIG. 19, I and Q output terminals of a mapping circuit 10 are connected to input terminals of data holding circuits 12I and 12Q, respectively. The output terminals of data holding circuits 12I and 12Q are connected to input terminals of waveform forming circuits 13I and 13Q, respectively. The output terminals of waveform forming circuits 13I and 13Q are connected to D/A converters 14I and 14Q, respectively. The output terminals of D/A converters 14I and 14Q are connected to filters 16I and 16Q through adders 15I and 15Q, respectively. The output terminals of filters 16I and 16Q are connected to input terminals of modulators 18I and 18Q, respectively, and the modulators 18I and 18Q include multipliers 19I and 19Q, respectively. The multiplier 19I multiplies an I signal output from the filter 16I by a carrier signal output from an oscillator 20 to modulate the carrier signal, whereas the multiplier 19Q multiplies a Q signal output from the filter 16Q by a phase-shifted carrier signal output from a π/2 phase shifter 21 for π/2 phase-shifting a carrier signal of the oscillator 20 thereby to modulate the phase-shifted carrier signal.

The signals modulated by the modulators 18I and 18Q are added to each other by an adder 24. The added signal is amplified by an amplifier 25 and then transmitted through an antenna.

Transmitting equipments according to various embodiments will now be described, with reference to the accompanying drawings.

Figure 20:
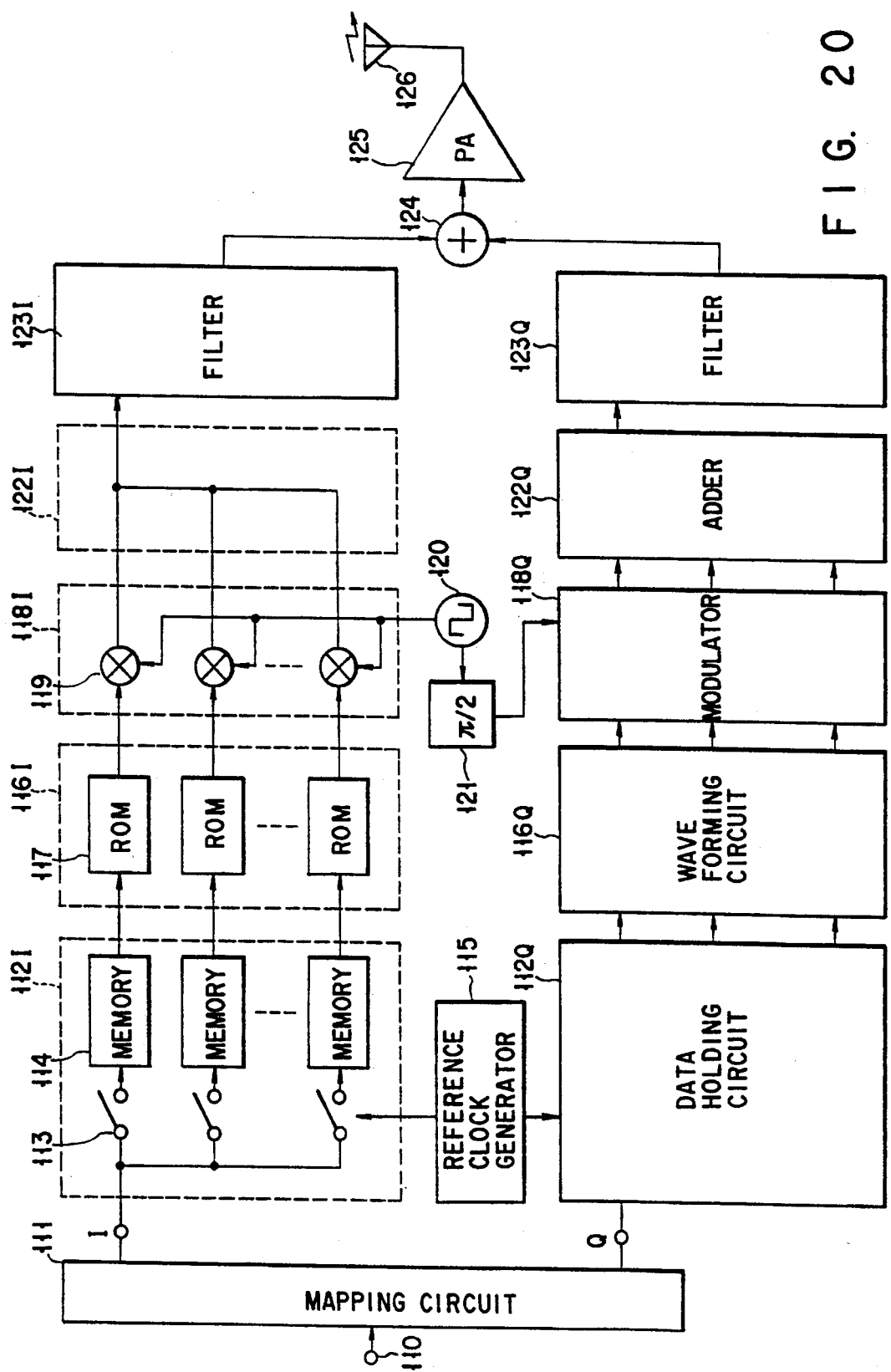
FIG. 20 is a block diagram of a transmitting equipment using a modulated signal generating apparatus according to a thirteenth embodiment of the present invention.

FIG. 20 shows a constitution of a transmitting equipment including QPSK signal generating apparatus according to the thirteenth embodiment of the present invention. In the transmitting equipment shown in FIG. 20, an input terminal 110 is supplied with time-series digital signals. The signals are converted into I and Q signals of n-bit (for example, n=2) data constituting a QPSK code, by a mapping circuit 111. The I and Q signals are input to I- and Q-channel signal generators, respectively. These generators have the same structure as described below.

The I and Q signals output from the mapping circuit 111 are sent to data holding circuits 112I and 112Q, respectively. The circuits 112I and 112Q each include plural (m) switches 113 and m̲ memories 114 of n-bit latches connected to the switches 113. The switches 113 are sequentially turned on in response to reference clock signals generated from a reference clock signal generator 115, and the I and Q signals are supplied bit by bit to the memories 114 accordingly. The memories 114 output the n-bit data at the same time, in other words, the data holding circuits 112I and 112Q output the I and Q signals of input time-series digital signals m̲ by m̲ (m=n×m bits) in parallel with each other.

The m̲ digital signals output from the data holding circuits 112I and 112Q are supplied to waveform forming circuits 116I and 116Q, respectively. The circuits 116I and 116Q each include $m$ ROMs 17 in which impulse responses of the roll-off filter to the $m$ digital signals output from the data holding circuits 112I and 112Q are stored as oversampling codes. The waveform forming circuits 116I and 116Q output the oversampling codes as waveform-shaped signals.

The above impulse responses of the roll-off filter overlap each other in terms of time. In other words, the impulse responses to the digital signals of I and Q signals continue until the supply of $m$ digital signals to the data holding circuits 112I and 112Q is completed. In order to obtain the impulse responses of the digital roll-off filter to the $m$ digital signals, the apparatus of the thirteenth embodiment comprises the above-described data holding circuits 112I and 112Q and $m$ ROMs 117 included in the waveform forming circuits 116I and 116Q.

The waveform-shaped signals output from the circuits 116I and 116Q are supplied to modulators 118I and 118Q, respectively. Each of the modulators includes $m$ multipliers (or mixers) 119. While the modulator 181I multiplies a waveform-forming signal output from the waveform forming circuit 116I by a first carrier wave signal output from an oscillator 120 to modulate the first carrier wave signal, the modulator 181Q multiplies a waveform-forming signal output from the waveform forming circuit 116Q by a second carrier wave signal, generated from the first carrier wave signal supplied through a π/2 phase shifter 121, to modulate the second carrier wave signal. The modulators 118I and 118Q thus constitute an orthogonal modulator. The waveforms of the carrier wave signals are favorably rectangular.

The $m$ modulated signals output from the modulator 118I are added by an adder 122I, while the $m$ modulated signals output from the modulator 118Q are added by an adder 122Q. The signals added by the adders 122I and 122Q are transmitted to filters (generally band-pass filters) 123I and 123Q, respectively to eliminate high-frequency components of unnecessary outband components produced from the modulators 118I and 118Q. The output signals of the filters 123I and 123Q are added by an adder 124 to finally generate a QPSK signal.

The mapping circuit 111, data holding circuits 112I and 112Q, waveform forming circuits 116I and 116Q, modulators 118I and 118Q, adders 122I and 122Q, filters 123I and 123Q, and adder 124 constitute the QPSK signal generators. The QPSK signal so generated is amplified by a power amplifier 125 and then transmitted through an antenna 126.

The conventional QPSK signal generator necessitates a digital adder since infinite impulse responses to a plurality of digital signals are added at the stage prior to a D/A converter; therefore, the apparatus is increased in scale. In contrast, according to the thirteenth embodiment of the present invention, since the adders 122I and 122Q are constituted as analog adders and the waveform-forming signals are represented by oversampling codes, the number of bits of the D/A converter can be decreased by 1 bit. Thus, the scale of the circuit of the signal generator can be made much smaller than that of the signal generator using the digital adder, with the result that the QPSK signal generator can be reduced in size.

Furthermore, the conventional QPSK signal generator needs a modulator having good analog characteristics since the signal input to the modulator is an analog signal. According to the thirteenth embodiment of the present invention, since one-bit codes are used as oversampling codes of waveform-shaped signals output from the waveform forming circuits 116I and 116Q, the signals input to the modulators 118I and 118Q correspond to one-bit codes. If, therefore, a carrier wave signal is a rectangular wave, the modulators can be constituted mainly by switches of MOS transistors or the like, and an adverse effect of the element accuracy of an analog circuit on the modulation accuracy of QPSK signals, can be reduced.

If the modulated signals output from the modulators 118I and 118Q are represented by voltage signals, the adders 122I and 122Q are considered to be voltage adders, whereas if the modulated signals are represented by current signals, the adders are able to add the current signals only by connecting the input lines of the adders (output lines of modulators 118I and 118Q). Since, in this case, the adders 122I and 122Q are accomplished only by connecting the lines, no special hardware circuits such as a voltage adder are required, with the result that the constitution of the QPSK signal generator can be simplified further.

The other embodiments of the present invention will now be described. In the following embodiments, the elements which are equal to or correspond to those of FIG. 20 are denoted by the same reference numerals, and their descriptions are omitted.

Figure 21:
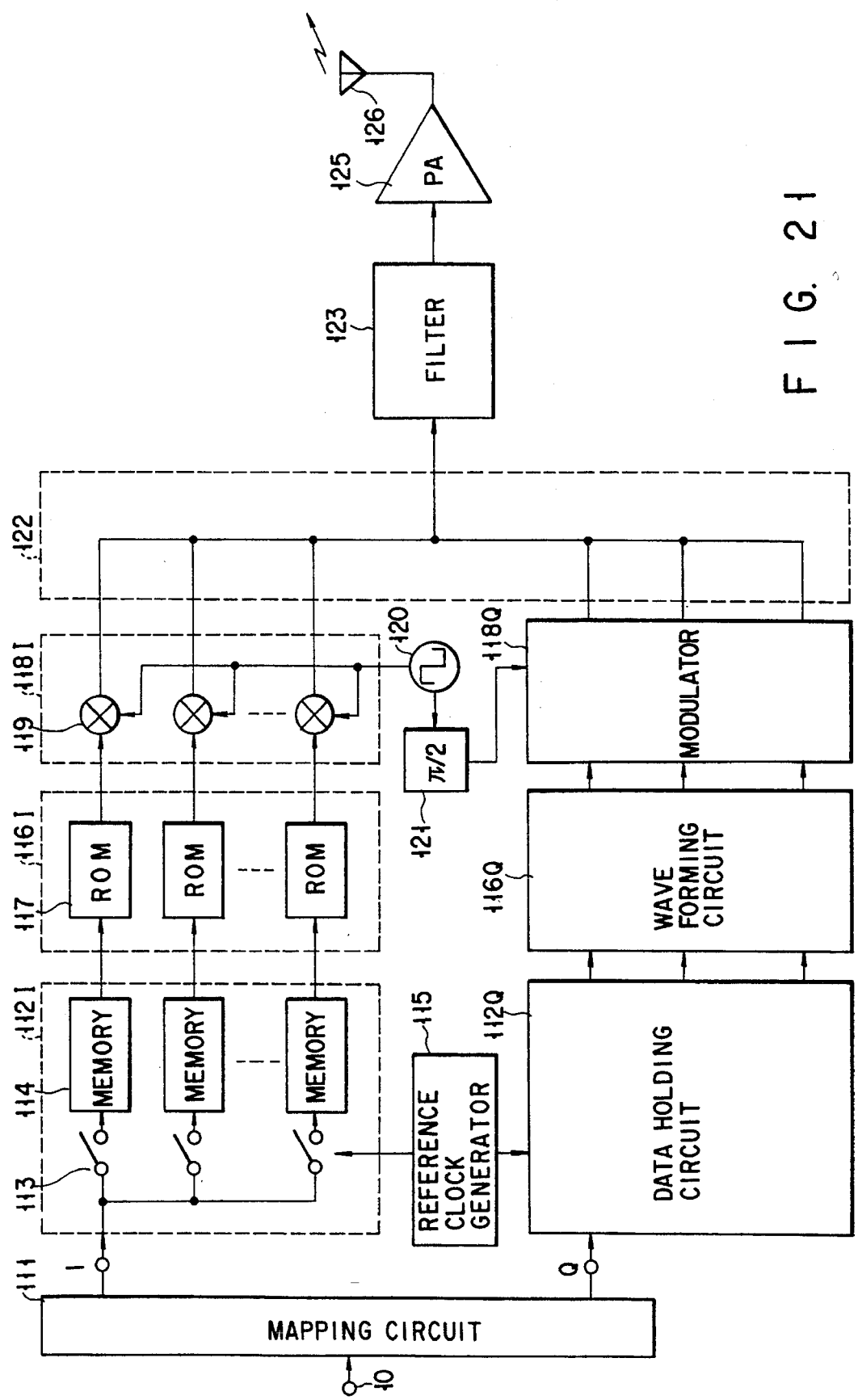
FIG. 21 is a block diagram of a transmitting equipment using a modulated signal generating apparatus according to a fourteenth embodiment of the present invention.

FIG. 21 illustrates the constitution of a transmitting equipment including QPSK signal generators according to the fourteenth embodiment of the present invention. In this embodiment, the adders 122I and 122Q of FIG. 20 are formed as a single adder 122, and the filters 123I and 123Q thereof can be combined into a single filter 123. In the fourteenth embodiment, too, if the modulated signals output from modulators 118I and 118Q are expressed as current signals, the adder 122 can be formed by adding the current signals by line connection.

FIGS. 22A and 22B each show the constitution of a QPSK signal generator according to the fifteenth embodiment of the present invention. In FIGS. 22A and 22B, only the I-channel signal generators are shown, and the Q-channel signal generators having the same structure are omitted. According to the fifteenth embodiment, as shown in FIG. 22A, D/A converters 124I are inserted between a modulator 118I and an adder 122I and, as shown in FIG. 22B, D/A converters 124 are inserted between a waveform forming circuit 116I and a modulator 118I. The Constitutions of the apparatuses shown in FIGS. 22A and 22B are also effective when a waveform-forming signal output from the waveform forming circuit 116I is represented by a code of a relatively small number of bits, such as 2 bits and 3 bits, as well as one-bit code such as a typical oversampling code. In the thirteenth embodiment shown in FIG. 20, since the waveform-forming signal is represented by a one-bit code, one-bit D/A converters are used for the D/A converters 124I of the fifteenth embodiment, though the one-bit D/A converters are omitted from FIG. 20.

FIGS. 23 and 24 specifically show one-bit D/A converters 124 when the waveform-forming signals are represented by one-bit codes. The D/A converter shown in FIG. 23 includes inverters 141 and resistance elements 142, and that shown in FIG. 24 is a differential amplifier 150. The amplifier 150 is constituted by a pair of complementary transistors 151 and 152 whose sources (or emitters) are connected to each other and a current source 153 connected to the common source (or common emitter). The gates (or bases) of the transistors 151 and 152 are supplied with differential signals as input signals 1 and 2, and the differential signals are output from the drains (or collectors) thereof.

In the sixteenth embodiment shown in FIG. 25, a data holding circuit 112I (112Q), which is modification to that of the thirteenth embodiment shown in FIG. 20, is used. The data holding circuit shown in FIG. 25 is formed by connecting n-bit memories 161-1 to 161-(m−1) (the number of which is m−1) in series. The n-bit data of I or Q signals stored in the memories are output to the waveform forming circuit 116I or 116Q and simultaneously transferred in sequence to the subsequent memories in response to reference clock signals.

Assume that signals A, B, C and D of n-bit data are sequentially input as I or Q signals. First the signal A is output from an output terminal 162-0 in response to a reference clock signal. In response to the next reference clock signal, the signal A is output from an output terminal 162-1 of the memory 161-1 and the signal B is output from the output terminal 162-0. In the next reference clock signal, the signal A is output from an output terminal 162-2 of the memory 161-2, the signal B is output from the output terminal 162-1, and the signal C is output from the output terminal 162-0. In response to the next reference clock signal, the signal A is output from an output terminal 162-3 of the memory 161-3, the signal B is output from the output terminal 162-2, the signal C is output from the output terminal 162-1, and the signal D is output from the output terminal 162-0.

As described above, according to the data holding circuit shown in FIG. 25, the same signals are output in sequence from different output terminals 162-0 to 162-(m−1), with the result that the I and Q signals of input time-series signals are output $\underline{m}$ by $\underline{m}$ (m=n×m bits) in parallel with each other. Consequently, the data holding circuit of FIG. 25 makes the constitution of the waveform forming circuits 116I and 116Q of FIG. 20 easier.

In the data holding circuits 112I and 112Q illustrated in FIG. 20, oversampling codes, which correspond to impulse responses of the digital roll-off filter to all of the above signals A, B, C, D, . . . , have to be stored in the $\underline{m}$ ROMs 117 constituting the waveform forming circuits 116I and 116Q. In contrast, in the data holding circuit 112I (112Q), since the same input signals are repeatedly output from the different output terminals, the data, which are obtained by oversampling some of impulse responses of the digital roll-off filter with respect to the same input signals, the some of impulse responses being obtained by window-controlling the impulse responses in different m/l sections, have only to be stored in the $\underline{m}$ ROMs 117 of the waveform forming circuit 116I (116Q). With the arrangement of the data holding circuit shown in FIG. 25, the capacity of the ROMs 17 can be decreased to 1/m.

FIG. 26 shows the constitution of the main part of a QPSK signal generator according to the seventeenth embodiment of the present invention. In the seventeenth embodiment, the input time-series digital signal is converted into I and Q signals, which constitute a QPSK signal, by the mapping circuit 11 shown in FIG. 20. The I (Q) signals are supplied to an address generator 171 through a data holding circuit 112I (112Q) every I (Q) channel. The circuit 171 generates address signals corresponding to various combinations of the I (Q) signals and supplies them to a ROM 172. The ROM 172 stores data of impulse responses of the digital roll-off filter to the I (Q) signals. In response to the address signals supplied from the address generator 171, the data of impulse responses is read out from the ROM 172. The read-out data is converted into an analog signal by a D/A converter 173. The analog signal is input to a multiplier 174 constituting a modulator, and multiplied by a carrier wave signal and modulated. The modulated signal output from the multiplier 174 is changed to a QPSK signal by eliminating unnecessary out-band components therefrom by a filter 123I (123Q).

As shown in FIG. 27, the address generator 171 comprises a shift register 181 including a plurality of series-connected delay elements (memories) DL and an address conversion circuit (counter) 182, and the first stage delay element of the shift register 181 is supplied with I (Q) signal. The address conversion circuit 182 outputs an address signal corresponding to a clock signal.

The QPSK signal is represented by the sum (accumulation) of impulse responses of the digital roll-off filter. The impulse responses are stored in the ROM 172 and read out therefrom in response to the address signal output from the address generator 171. Consequently, the function of the data holding circuit 112I (112Q) and that of the waveform forming circuit 116I (116Q) can be achieved by the single ROM 172, and the constitution of the apparatus can be simplified further.

In the seventeenth embodiment, too, if the impulse responses stored in the ROM 172 are one-bit data such as a typical oversampling code, the D/A converter 173 can be a one-bit D/A converter.

FIG. 28 shows the constitution of the main part of a QPSK signal generator according to the eighteenth embodiment of the present invention. The input time-series digital signal is converted into I and Q signals, which constitute a QPSK signal, by the mapping circuit 111 shown in FIG. 20. The I (Q) signal is supplied to an address generator 191 through a data holding circuit 112I (112Q) for each of I and Q channels. The address generator 191 selectively generates a plurality of address signals corresponding to the schemes of the I and Q signals and supplies them to a ROM 192. The ROM 192 stores data of impulse responses of the digital roll-off filter to the I and Q signals.

The data of impulse responses is read out from the ROM in response to the address signals and then supplied to a data latch circuit 193. The circuit 193 includes a plurality of switches 193a and a plurality of memories (e.g., latches) 193b connected in series to the switches 193a. The data latch circuit 193 outputs data retained in the memories 193b addressed by the address generator 191.

The ROM 192 stores waveform data (impulse response data) of the waveforms $\underline{a}$ and $\underline{b}$ shown in FIG. 12 in matrix and, more specifically, it stores waveform data items $a_1$, $a_2$, $a_3$, $a_4$, ... of waveform $\underline{a}$, waveform data items $b_1$, $b_2$, $b_3$, $b_4$, ... of waveform $\underline{b}$, waveform data items $c_1$, $c_2$, $c_3$, $c_4$, ... of waveform $\underline{c}$, as shown in FIG. 29. These waveform data items are read out of the ROM 192 in response to the address signals output from the address generator 191. If I signals are input to the address generator 191 through, for example, the data holding circuit 112I in the order of 1, 1/√2 and 0 on the IQ plane shown in FIG. 13, the address generator 191 generates address signals of waveform data items $a_1$, $b_2$ and $c_3$ corresponding to 1,1/√2 and 0, respectively. The waveform data items are read out of the ROM 192 and sent to the data latch circuit 193. In this circuit 193, the switches 193a are switched in accordance with the sequence of data of the data holding circuit 112I, and the waveform (impulse response) data read out from the ROM 192 is stored selectively in the memories 193b. The impulse response data is then read out from the memories 193b in response to the address signals generated from the address generator 191.

The read-out impulse response data is supplied to a plurality of multipliers 195 each constituting a modulator, and multiplied by a carrier wave signal to be modulated. The modulated signals output from the multipliers 195 are converted into analog signals by D/A converters 196 and then added together by an adder 122I or 122Q. These analog signals correspond to the modulated signals obtained by superposing the impulse responses one on another. Further, the analog signals are changed to QPSK signals by removing unnecessary outband components therefrom by a filter 123I or 123Q.

According to the eighteenth embodiment, the impulse responses of the digital roll-off filter corresponding to various I or Q signals are stored in the single ROM 192, the address of the ROM 192 is changed by the address generator 191 in accordance with the I or Q signal scheme, and data items of the impulse responses to the I or Q signal scheme are sequentially read out from the ROM; therefore, the memory capacity of the ROM 192 has only to be almost equal to that of one of the ROMs 117 constituting the waveform forming circuit 116I or 116Q shown in FIG. 20. Consequently, the memory capacity of the ROMs can be used more effectively than in the case of the thirteenth embodiment shown in FIG. 20 wherein one impulse response data corresponds to one ROM 117.

The impulse response data items corresponding to the input I or Q signal scheme are stored in the respective memories 193b of the data holding circuit 193, and read out in parallel in response to clock signals. Moreover, the plural impulse response data items are stored in a ROM table, and can be selectively output therefrom in response to the address signal.

In the eighteenth embodiment, the data holding circuit 193 is provided so as to hold the impulse response data stored in the ROM 192. However, it can be provided so as to hold the I or Q signal scheme of input signals or the analog data obtained by D/A conversion.

FIG. 30 shows the constitution of the main part of a QPSK signal generator according to the nineteenth embodiment of the present invention. In this apparatus, an input time-series digital signal is converted into I and Q signals, which constitute a QPSK signal, by the mapping circuit 111 shown in FIG. 20, and the I and Q signals are supplied to I and Q signal processing circuits, respectively.

In the I or Q signal processing circuit, the input I or Q signal is delayed in order by a plurality of series-connected delay elements 201. The I or Q signals and the output signals of the delay elements are input to a plurality of ROMs 202 as address signals. The ROMs 202 store impulse responses of the digital roll-off filter to the I or Q signals.

The impulse responses to the I and Q signals overlap each other, as shown in FIG. 9. In the nineteenth embodiment, therefore, the waveform of a impulse response is divided into plural waveform sections and these sections are stored in the ROMs 202, respectively. In other words, the I or Q signal is divided into plural signals by the delay elements 201, these signals are supplied to their respective ROMs 202 as address signals, and the signals corresponding to the impulse responses are individually read out of the ROMs 202.

The output signals of the ROMs 202 are modulated by a plurality of multipliers 203 each constituting a modulator and provided with predetermined weighted coefficients by weighting circuits 204. The modulated signals weighted by the weighting circuits 204 are converted into analog signals by D/A converters 205, and the analog signals are added together by an adder circuit 122I or 122Q as in the case of the embodiment shown in FIG. 20. The analog signals are changed to QPSK signals by eliminating unnecessary components therefrom by a filter 123I or 123Q.

In the nineteenth embodiment, the weighted coefficients $\alpha i$ (i=1, 2, ..., n) of the weighting circuits 204 are varied according to the amplitudes of the impulse response waveforms shown in FIG. 9. More specifically, the weighted coefficient $\alpha i$ is small when the amplitudes are small, whereas it is large when they are large. If the impulse response data stored in the ROMs 202 is multiplied by $1/\alpha i$, an adverse effect of quantizing noise can be reduced. The impulse response of the roll-off filter is a signal whose amplitude is small at both ends of data and large in the middle thereof, as shown in FIG. 9. This signal is represented as only a binary signal in $\Delta\Sigma$ modulation, with the result that the difference between the binary signal and impulse response signal becomes a quantizing noise. To reduce the quantizing noise, the binary signal is varied such that its amplitude approaches that of the impulse response signal.

FIG. 31 shows the constitution of the main part of a QPSK signal generator according to the twentieth embodiment of the present invention. The twentieth embodiment differs from the nineteenth embodiment shown in FIG. 30 only in that the impulse responses of the digital roll-off filter to various I or Q signals are stored in ROMs 202 as one- or several-bit signals which are modulated by an oversampling modulator represented by a $\Delta\Sigma$ modulator.

The impulse response waveform Sa shown in FIG. 12 is divided into a plurality of waveforms Sd, and the waveforms Sd are converted into $\Delta\Sigma$ modulated data and stored in the ROMs 202. Each of the ROMs 202 includes five memory regions corresponding to the values of I or Q axis on the IQ plane shown in FIG. 13, that is, 1, $1/\sqrt{2}$, 0, $-1/\sqrt{2}$, and $-1$. If these memory regions are addressed by the I or Q signal, the $\Delta\Sigma$ modulated data corresponding to the I or Q signal is read out from the ROM.

Since the above one- or several-bit signals are stored in the ROMs 202, the circuit scale of D/A converters 206 for converting the modulated signals output from multipliers 203 into analog signals, is remarkably reduced. In particular, if a one-bit code is used as the $\Delta\Sigma$ modulated data, a one-bit D/A converter can be employed and its advantage is great. More specifically, if a one-bit code is used, the output code length of the D/A converters 206 is one bit, with the result that not only the circuit scale of the D/A converters can be reduced, but also the converters can be formed of switch elements and no element accuracy is required in terms of principle. Therefore, the QPSK signal generator can easily be constituted. Since, furthermore, an oversampling code is employed, a high-performance filter is not required.

As in the nineteenth embodiment, the weighted coefficients $\alpha i$ of weighting circuits 204 are varied according to the impulse response waveforms. The weighted coefficient $\alpha i$ is small when the amplitudes are small, whereas it is large when they are large. If the impulse response data stored in the ROMs 202 is multiplied by $1/\alpha i$, an adverse effect of quantizing noise can be reduced.

FIG. 14 shows variations in amplitude of output waveform corresponding to one impulse response. In FIG. 14, the ordinates indicates the amplitude, and the abscissa does time. As is apparent from the figure, the variations in amplitude are represented by a stepwise envelope, and the quantizing noise in the $\Delta\Sigma$ modulated signal can be reduced remarkably, the reason for which has been described above with reference to FIG. 9. Therefore, any special filtering characteristics are not required for the filters 123I or 123Q for eliminating unnecessary components.

FIG. 32 shows the constitution of the main part of a QPSK signal generator according to the twenty-first embodiment of the present invention. In the twenty-first embodiment, current-output type D/A converters, as shown in FIG. 23 or 24, are employed as one-bit D/A converters 206, and the current outputs of these D/A converters 206 are added by line connection to constitute adders 122I or 122Q. The circuit scale of the adders can thus be decreased. Even though the D/A converters 206 are of a voltage-output type, their voltage outputs are converted to current outputs and the current outputs are added together by line connection. In this case, too, the same advantage can be obtained.

When the D/A converters 206 are of a current-output type, filter 123I or 123Q connected to the output of the adder 122I or 122Q can be of a current type or a voltage type. In the case of the voltage type, the output of the adder 122I or 122Q is converted to a voltage signal, and this signal is supplied to the filter 123I or 123Q.

In the QPSK signal generator according to the above-described embodiments, quantizing noise in the band can be reduced by noise shaping. From a different point of view, however, this means that noise outside the band increases. Thus, interference with other signals may become a problem. To reduce the interference, the $\Delta\Sigma$ modulator shown in FIG. 17 can be employed. More specifically, by generating impulse response data to be stored in the ROMs using an oversampling-type converter with such a noise shaping characteristic as to suppress the noise level in a specific frequency band, the level of unwanted noise in the specific frequency band can be suppressed, thereby alleviating the requirements for the filters 123I and 123Q for eliminating unnecessary outband components.

If a $\Delta\Sigma$ modulator as shown in FIG. 17 is used, as is understood from FIG. 18 showing the noise shaping characteristic with a zero at 600 kHz, noise is reduced in the vicinity of a frequency of 600 kHz at which interference will occur. In the conventional QPSK signal generator, it was necessary to suppress the noise sufficiently with filters (corresponding to the filters 123I and 123Q of the present invention) in the rear stage. However, in the present invention, requirements for the characteristics of the filters 123I and 123Q can be relaxed, which is helpful in making the QPSK signal generator more compact.

A QPSK signal generator according to a twenty-second embodiment of the present invention will now be described, with reference to FIG. 33. In this embodiment, the D/A converter of each of the above embodiments is replaced with an FIR filter including a plurality of delay elements 301 each constituted by a digital DFF (D-type flip-flop), a plurality of weighting multipliers 302, and a single adder 303. The weighting multipliers 302 multiply input signals and delay signals output from the delay elements 301 by the respective weighted coefficients. The signals output from the multipliers 302 are added together by the adder 303, and a sum of the signals is output therefrom. As illustrated in FIG. 34, the weighting multipliers 302 includes a plurality of inverters 304 receiving the input signals and the delay signals of the delay elements 301, and a plurality of resistive elements 305 of different resistance values. The weighting multipliers 302 convert the input signals of digital signals into current signals, i.e., analog signals through the inverters 304 and resistive elements 305. The output signals of the inverters 304 are weighted with the resistance values of the resistive elements 305. The current signals are synthesized at connection nodes of the resistive elements 305 to generate a sum signal.

According to the signal generator described above, if $\Delta\Sigma$ data is one bit, the DFF is also one bit; therefore, an increase in circuit scale of the signal generator can be minimized. Even if the $\Delta\Sigma$ data is a plurality of bits, the DFF can be set to at most several bits.

Figure 35:
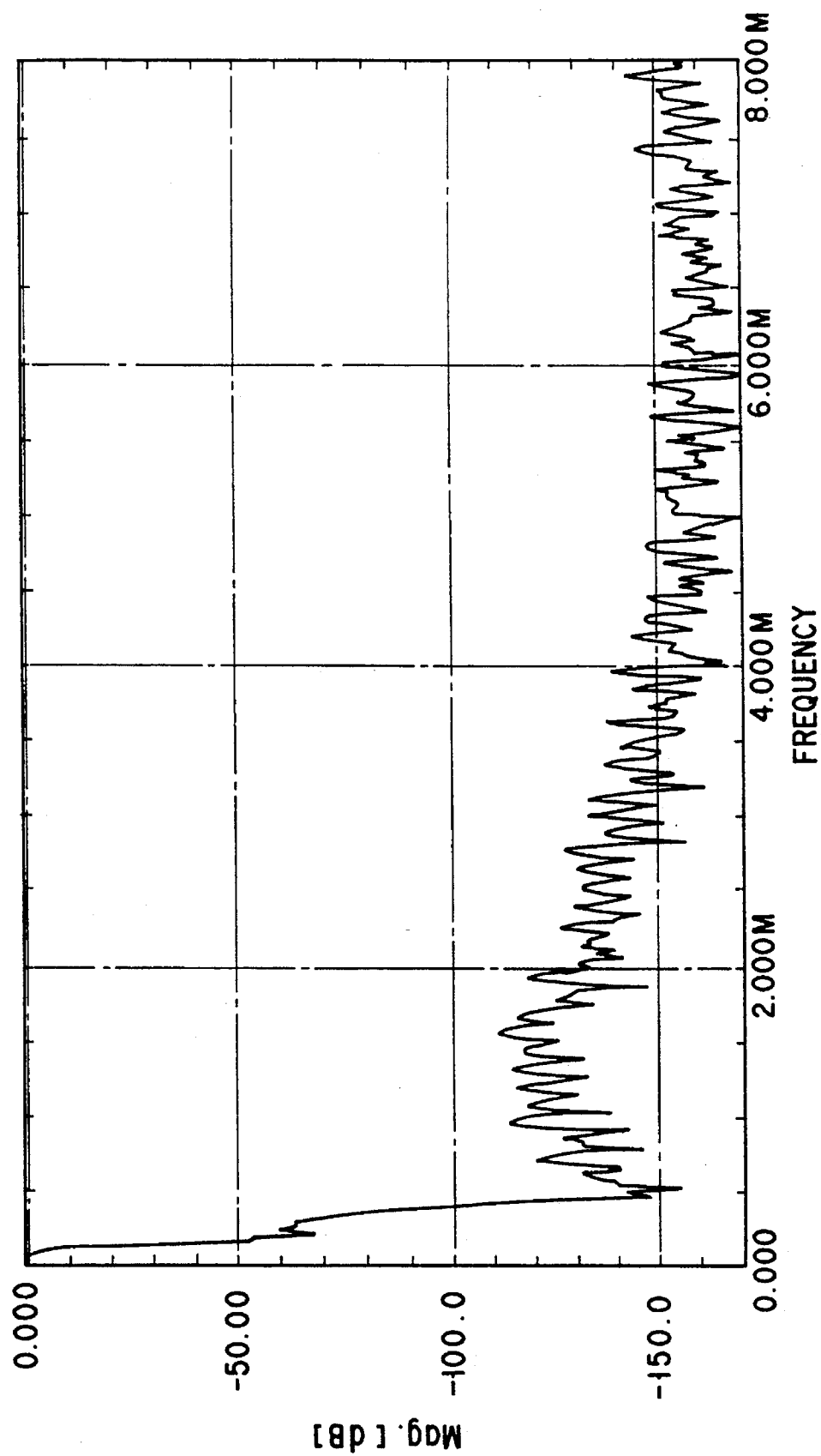
FIG. 35 is a diagram showing a spectrum of signals 10 output from a QPSK signal generator using the FIR filter shown in FIG. 33.

FIG. 35 shows a spectrum of signals generated from the QPSK signal generator according to the twenty-second embodiment. Since it is apparent from FIG. 35 that the level of noise is lowered in a range exceeding the baseband frequency, the aliasing component which is an integral multiple of the clock frequency has only to be attenuated in the filter at the posterior stage. The clock frequency can be set considerably higher than the baseband frequency by oversampling. It is thus possible to eliminate wide-band noise by a low-order filter (C-R filter) constituted of a capacitor and a resistor. Even though the values of the capacitors and resistors are each about twice as large as a prescribed value, good frequency characteristics can be obtained sufficiently.

FIG. 36 shows another example of an FIR filter which is applied to a QPSK signal generator according to the twenty-third embodiment of the present invention. In this embodiment, an input signal is converted into I and Q signals by a mapping circuit 401, and these I and Q signals are supplied to a plurality of ROMs 402 for storing impulse responses of roll-off filter and delay circuits 403. The ROMs 402 output one-bit impulse response signals corresponding to the I and Q signals. The ROMs 402 previously stores one-bit data into which the impulse responses are converted by an oversampling type modulator such as a $\Delta$–$\Sigma$ converter. The data read out from each of the ROMs 402 is sent to the first stage of plural DFFs 404 connected in cascade. The DFFs 404 drive current-output type D/A converters 405. In other words, differential transistor pairs, that is, differential amplifiers of the D/A converters 405 are operated in response to signals output from the DFFs 404. Each of constant-current sources 406 is connected to a common terminal of each differential transistor pair, and the currents of the constant-current sources 406 are added through the differential amplifiers. The constant-current sources 406 are set to different current values, and the filter coefficients of an FIR filter 400 are determined by the current values.

The output signals of the delay circuits 403 are supplied to the other ROMs 402(i) in which the other different impulse responses are stored, and those of the ROMs 402(i) are sent to their corresponding DFFs 404. Thus unnecessary frequency components are eliminated from the output signals of ROMs 402(i) by the FIR filter 400 whose filter coefficients are determined by the currents of the constant-current sources 406.

By connecting the FIR filter 400, the signals thereof are added, and currents I+ and I− are finally output.

With the above arrangement, unnecessary high-band noise components can greatly be attenuated, and a high-precision QPSK signal generator with less noise can be achieved only by a passive filter including an IC and constituted of a capacitor and a resistor.

The differential amplifiers 405 usually have the currents Imx of the same value in order to uniform the gains of signals output from the ROMs 402. If the foregoing FIR filter is not employed, the sum of the currents of the differential amplifiers has only to coincide with the current of a single differential amplifier, and an increase in current consumption is due to only the DFFs.

Furthermore, in the twenty-third embodiment, quantizing noise can be reduced by weighting the respective D/A converters 405. This weighting is achieved without equalizing the values of currents Imax, thereby suppressing an adverse effect of cancellation of data.

Figure 38:
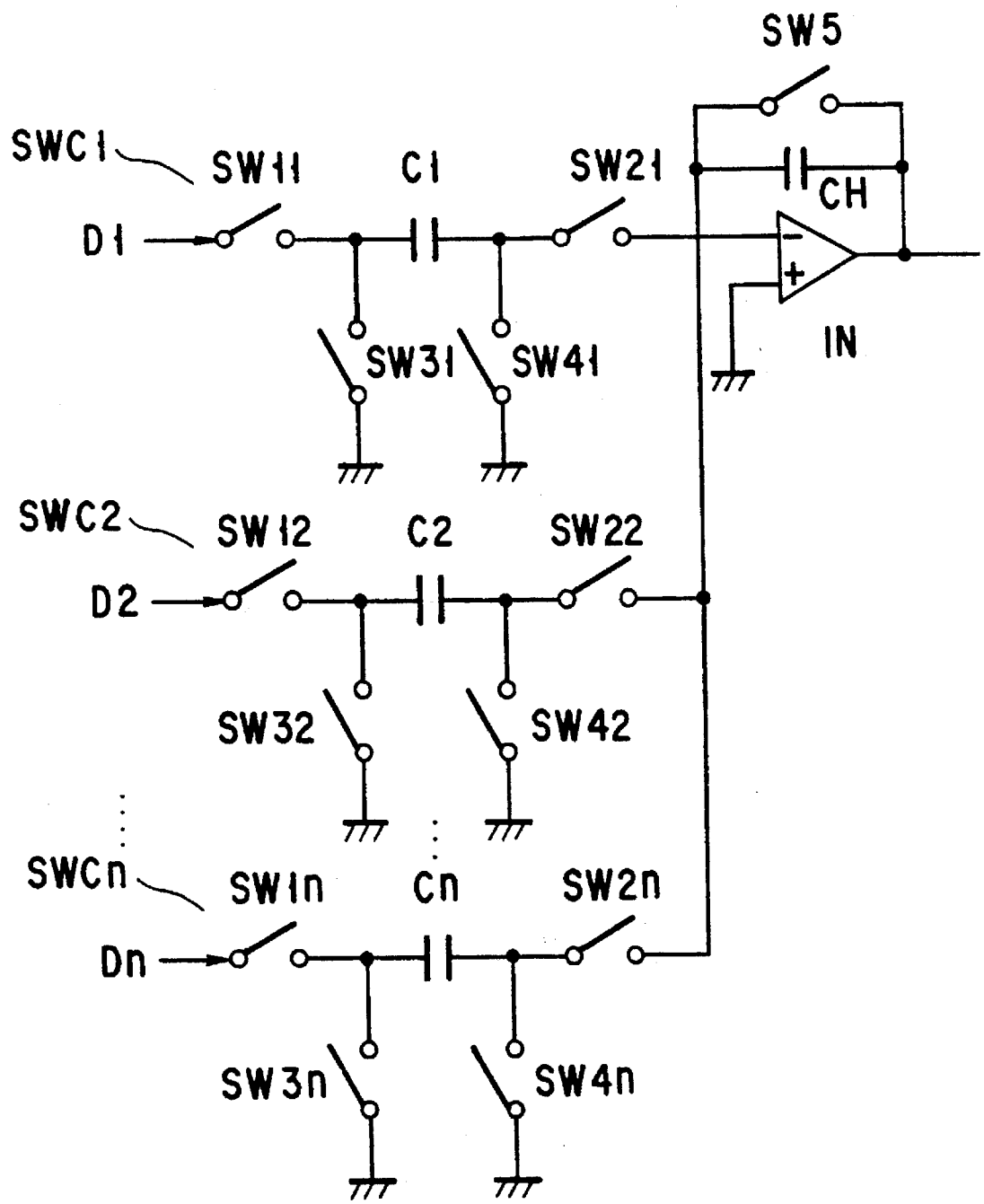
FIG. 38 is a circuit diagram of an FIR filter of the device shown in FIG. 37.

FIG. 37 shows still another example of an FIR filter which is applied to a QPSK signal generator according to the twenty-fourth embodiment of the present invention. In this embodiment, outputs D1, D2, . . . , Dn of DFFs 404 are added together by an adder constituted by a switched capacitor circuit 408. As shown in FIG. 38, the switched capacitor circuit 408 includes a plurality of switching circuits SWC1 ... SWCn each having switches SW11 (SW12, ..., SW1n) and SW21 (SW22, ..., SW2n) connected in series and switches SW31 (SW32, ..., SW3n) and SW41 (SW42, ..., SW4n) connected to both ends of a sampling capacitor C1 (C2, ..., Cn), inverters IN connected to the output terminals of the switching circuits SWC1 (SWC2, ..., SWCn), and holding capacitors $C_H$ and switches SW5 connected in parallel between the respective inverted input terminals and output terminals of the inverters IN. According to the switched capacitor circuit 408 so arranged, for example, the switches SW21 and SW31 are opened and switches SW11 and SW41 are closed to charge the sampling capacitor C1, while the switches SW21 and SW31 are closed and switches SW11 and SW41 are opened to discharge the capacitor C1. All charges emitted from the switching circuits SWC1, SWC2, ... SWCn are stored in the holding capacitor $C_H$, and an addition signal is generated. In other words, the sampling capacitor C1 sample data, and the holding capacitors $C_H$ hold data. The switches SW5 are shut when the capacitor $C_H$ is reset.

An operation of the switched capacitor circuit 408 will now be described more specifically. In section ck1, an input signal is sampled by a sampling capacitor C1 and the holding capacitor $C_H$ is reset. In section ck2, the charges stored in the sampling capacitor C1 are transferred to the holding capacitor $C_H$ and added together. The capacity of the sampling capacitors C1 of the switched capacitor circuit 408 is determined in accordance with filter coefficients required for the FIR filter 400, with the result that desired frequency characteristics of the FIR filter can be obtained.

Figure 39:
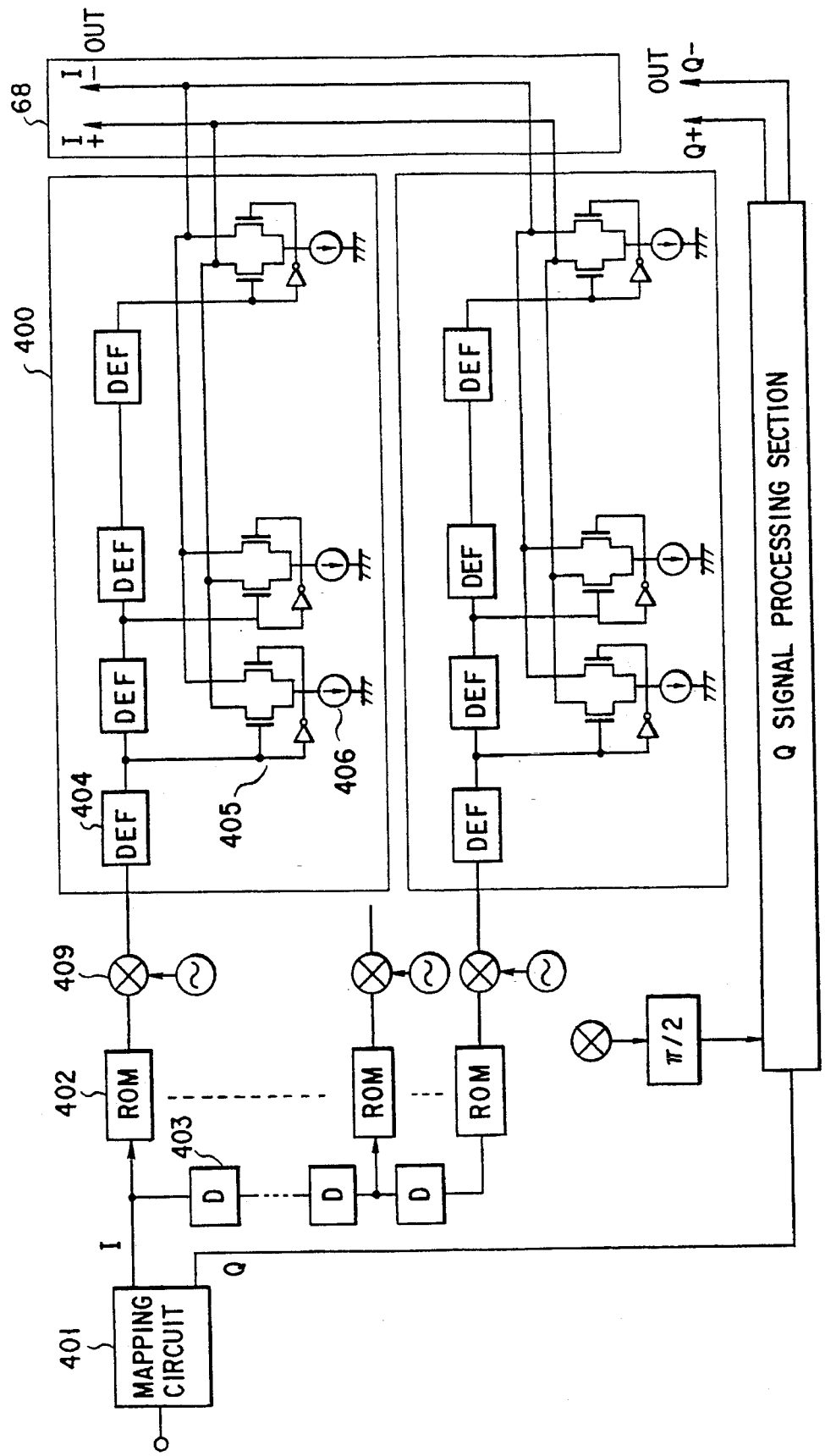
FIG. 39 is a block diagram showing the main part of a modulated signal generating device according to a twenty-fifth embodiment of the present invention.

FIG. 39 shows a QPSK signal generator according to the twenty-fifth embodiment of the present invention, to which the FIR filters 400 shown in FIGS. 36 and 37 are applied. In this embodiment, the outputs of ROMs 402 are supplied to multipliers 409 and modulated by carrier waves.

Conventionally, since analog signals are input to a modulator, good analog characteristics are required for the modulator. If, therefore, an oversampling type modulator is used to represent signal of a waveform forming circuit by one-bit codes, the inputs of the modulator are represented by one-bit codes. If rectangular wave are used for the carrier waves, the modulator can be constituted by switches or the like, with the result that the influence of the precision of analog elements upon the precision of the modulator can be suppressed.

However, the use of the oversampling type modulator causes a drawback of increasing noise outside a signal band. To resolve this drawback, the foregoing current-output type D/A converters are employed in the above embodiments of the present invention. The coefficients of the FIR filter using the current-output type D/A converters are set by the current values of the constant-current sources. If a filter tap is set to have band-pass characteristics, a modulated signal free of noise can be generated.

The FIR filters shown in FIGS. 33, 36, 37 and 38 can be substituted for the D/A converters 66 and coefficient multipliers 67 shown in FIG. 8, for the D/A converters 14I and 14Q shown in FIG. 19, and for the D/A converters shown in FIGS. 22, 28, 30, 31 and 32.

While in the above embodiments, the QPSK signal generators are used, the present invention is not limited to this type, but may be applied to an apparatus for generating 2-phase or 8-phase PSK signals and the other modulated signals, regardless of the signal type.

As described above, the present invention does not require a large-scale digital adder which was conventionally needed, thus reducing in circuit scale. Further, the modulators are formed by switches only, and the requirements for accuracy of circuit elements are remarkably alleviated. This makes it easier to form signal generators on VLSIs, improving in yield and consequently reducing in production cost.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A transmitting equipment comprising:

signal conversion means for converting a time-series input signal into first and second time-series digital signals;

signal holding means for dividing the first and second time-series digital signals from said signal conversion means into a plurality of first and second digital signals each consisting of a plurality of bits, holding the plurality of first and second digital signals, and outputting the plurality of first and second digital signals in parallel;

waveform forming means for outputting a plurality of first and second waveform data items respectively corresponding to the plurality of first and second digital signals output from said signal holding means;

D/A conversion means for converting the plurality of first and second waveform forming data items output from said waveform forming means into a plurality of first and second analog signals, respectively;

addition means for adding the plurality of first and second analog signals from said D/A conversion means and outputting first and second sum signals corresponding to the addition of the plurality of first analog signals and the addition of the plurality of second analog signals, respectively;

filter means for removing high-frequency components from the first and second sum signals output from said addition means;

orthogonal modulation means for orthogonally modulating the first and second sum signals, respectively, to output first and second orthogonal modulated signals; and transmitting signal generation means for adding the first and second orthogonal modulated signals from said orthogonal modulation means and generating a corresponding transmission signal.

2. The transmitting equipment according to claim 1, wherein said waveform forming means comprises a plurality of memory means for storing the plurality of first and second waveform forming data items.

3. The transmitting equipment according to claim 1, wherein said D/A conversion means includes a current conversion type D/A converter for converting the waveform forming data items from said waveform forming means into current signals, and said addition means includes an adder circuit for adding the current signals from said current conversion type D/A converter.

4. The transmitting apparatus according to claim 3, wherein said D/A conversion means includes a plurality of delay elements, connected in series and having a first-stage delay element for delaying the waveform forming data items, for outputting a plurality of delayed waveform data items, and an adder for adding signals output from a plurality of D/A conversion elements for weighting the waveform forming data items and the delayed waveform data items and converting weighted data items into analog signals.

5. The transmitting apparatus according to claim 4, wherein said plurality of delay elements includes D-type flip-flops, and said plurality of D/A conversion elements include a plurality of differential amplifiers driven by the delayed waveform data items and a plurality of constant-current sources for supplying the differential amplifiers with constant currents of different values.

6. The transmitting equipment according to claim 1, wherein said signal conversion means includes a mapping circuit for converting the input signal into the I and Q signals and constituting a QPSK code, and said signal holding means includes a plurality of signal holding circuits for holding the I and Q signals.

7. A transmitting equipment comprising:

holding means for dividing a time-series digital signal into a plurality of first and second digital signals each consisting of a plurality of bits, holding the plurality of first and second digital signals, and outputting the plurality of first and second digital signals in parallel;

waveform forming means, including memory means for storing a plurality of oversampling codes corresponding to the plurality of first and second digital signals output from said holding means, for reading the respective oversampling codes out of the memory means and outputting the oversampling codes as a plurality of first and second waveform forming signals;

modulation means for modulating the plurality of first and second waveform forming signals output from said waveform forming means and outputting a plurality of first modulated signals and a plurality of second modulated signals;

addition means for adding the plurality of first modulated signals and for adding the plurality of second modulated signals output from said modulation means and outputting first and second sum signals, respectively;

filter means for removing high-frequency components from the first and second sum signals output from said addition means; and transmitting signal generation means for adding the first and second sum signals from which the high-frequency components are removed by said filter means, and generating a transmitting signal.

8. The transmitting equipment according to claim 7, wherein said memory means stores $\Delta\Sigma$ modulated data as the oversampling codes.

9. The transmitting equipment according to claim 8, wherein said apparatus further comprises weighting means for weighting the plurality of first and second modulated signals output from said modulation means with respective weighting coefficients, and said addition means adds the plurality of a plurality of first and second modulated signals weighted by said weighting means to obtain a plurality of first and second sub signals.

10. The transmitting equipment according to claim 7, wherein said memory means stores a plurality of oversampling codes corresponding to combinations of the plurality of first and second digital signals output from said holding means, said waveform forming means reads the plurality of oversampling codes out of said memory means and outputs the oversampling codes as waveform forming signals.

11. A transmitting equipment comprising:

holding means for dividing a time-series digital signal into a plurality of first and second digital signals each consisting of a plurality of bits, holding the plurality of first and second digital signals, and outputting the plurality of first and second digital signals in parallel;

waveform forming means, including memory means for storing a plurality of first and second $\Delta\Sigma$ modulated data items corresponding to the plurality of first and second digital signals output from said holding means, for reading the respective plurality of first and second $\Delta\Sigma$ modulated data items out of the memory means and outputting the respective plurality of first and second $\Delta\Sigma$ modulated data items as a plurality of first and second waveform forming signals;

modulation means for modulating the plurality of first and second waveform forming signals output from said waveform forming means and outputting a plurality of first and second modulated signals;

addition means for adding the plurality of first modulated signals and for adding the plurality of second modulated signals output from said modulation means and outputting first and second sum signals, respectively;

filter means for removing high-frequency components from the first and second sum signals output from said addition means; and transmitting signal generation means for adding the first and second sum signals from which the high-frequency components are removed by said filter means, and generating a transmitting signal.

12. The transmitting equipment according to claim 11, wherein said apparatus further comprises weighting means for weighting the plurality of first and second modulated signals output from said modulation means with respective weighting coefficients, and said addition means adds the plurality of first and second modulated signals weighted by said weighting means to obtain the plurality of first and second sub signals.

13. The transmitting equipment according to claim 11, wherein said memory means stores a plurality of oversampling codes corresponding to combinations of the plurality of first and second digital signals output from said holding means, said waveform forming means reads the plurality of oversampling codes out of said memory means and outputs the oversampling codes as waveform forming signals.

14. A transmitting equipment comprising:

signal conversion means for converting a time-series input signal into I and Q signals;

signal holding means for dividing each of the I and Q signals from said signal conversion means into a plurality of digital signals each consisting of a plurality of bits, holding the plurality of digital signals, and outputting the plurality of signals in parallel;

waveform forming means for outputting a plurality of waveform forming data items corresponding to the plurality of digital signals of each of the I and Q signals output from said signal holding means;

D/A conversion means for converting the plurality of waveform forming data items output from said waveform forming means into a plurality of I and Q analog signals corresponding to each of the I and Q signals;

addition means for adding the plurality of I and Q analog signals from said D/A conversion means and outputting first and second sum signals corresponding to the addition of the I analog signals and the addition of the Q analog signals, respectively;

filter means for removing high-frequency components from the first and second sum signals output from said addition means;

orthogonal modulation means for orthogonally modulating the first and second sum signals, respectively, to output first and second orthogonal modulated signals; and transmitting signal generation means for adding the first and second orthogonal modulated signals from said orthogonal modulation means to generate a corresponding transmission signal.

15. A transmitting equipment comprising:

holding means for dividing a time-series digital signal into a plurality of I and Q digital signals each consisting of a plurality of bits, holding the I and Q digital signals, and outputting the plurality of I and Q digital signals in parallel;

waveform forming means, including memory means for storing a plurality of oversampling codes corresponding to the plurality of I and Q digital signals output from said holding means, for reading the respective oversampling codes out of said memory means and outputting the oversampling codes as a plurality of first and second waveform forming signals corresponding to the I and Q digital signals, respectively;

modulation means for modulating the plurality of first and second waveform forming signals output from said waveform forming means and outputting a plurality of first and second modulated signals corresponding to the I and Q digital signals, respectively;

addition means for adding the plurality of first modulated signals and for adding the plurality of second modulated signals output from said modulation means and outputting first and second sum signals corresponding to the summed first and second modulated signals, respectively;

filter means for removing high-frequency components from the first and second sum signals output from said addition means; and transmitting signal generation means for adding the first and second sum signals from which the high-frequency components are removed by said filter means, and generating a corresponding transmitting signal.

16. A transmitting equipment comprising:

holding means for dividing a time-series digital signal into a plurality of I and Q digital signals each consisting of a plurality of bits, holding the plurality of I and Q digital signals, and outputting the plurality of I and Q digital signals in parallel;

waveform forming means, including memory means for storing a plurality of first and second $\Delta\Sigma$ modulated data items corresponding to the plurality of I and Q digital signals output from said holding means, for reading the respective plurality of first and second $\Delta\Sigma$ modulated data items out of said memory means and outputting the respective plurality of first and second $\Delta\Sigma$ modulated data items as a plurality of first and second waveform forming signals corresponding to the I and Q digital signals, respectively;

modulation means for modulating the plurality of first and second waveform signals output from said waveform forming means and outputting a plurality of first and second modulated signals corresponding to the I and Q digital signals, respectively;

addition means for adding the plurality of first and second modulated signals output from said modulation means and outputting first and second sum signals corresponding to sums of the modulated first and second signals, respectively;

filter means for removing high-frequency components from the first and second sum signals output from said addition means; and transmitting signal generating means for adding the first and second sum signals from which the high-frequency components are removed by said filter means, and generating a transmitting signal.

* * * * *